(12) United States Patent
Mori et al.

(10) Patent No.: US 10,706,925 B2
(45) Date of Patent: Jul. 7, 2020

(54) NON-VOLATILE MEMORY DEVICE AND METHOD OF CONTROLLING NON-VOLATILE MEMORY DEVICE

(71) Applicant: Sony Semiconductor Solutions Corporation, Kanagawa (JP)

(72) Inventors: Yotaro Mori, Kanagawa (JP); Makoto Kitagawa, Chiba (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/516,542

(22) PCT Filed: Sep. 29, 2015

(86) PCT No.: PCT/JP2015/077437
§ 371 (c)(1),
(2) Date: Apr. 3, 2017

(87) PCT Pub. No.: WO2016/072173
PCT Pub. Date: May 12, 2016

(65) Prior Publication Data
US 2017/0309335 A1  Oct. 26, 2017

(30) Foreign Application Priority Data
Nov. 6, 2014  (JP) .................................. 2014-225924

(51) Int. Cl.
*G11C 13/00*       (2006.01)
(52) U.S. Cl.
CPC ...... *G11C 13/0069* (2013.01); *G11C 13/0026* (2013.01); *G11C 13/0028* (2013.01);
(Continued)
(58) Field of Classification Search
CPC ........................ G11C 13/0069; G11C 13/0097
(Continued)

(56) References Cited

U.S. PATENT DOCUMENTS 8,422,269 B2 * 4/2013 Sasaki ................ G11C 13/0026
365/148
2011/0044088 A1 * 2/2011 Muraoka ............ G11C 13/0007
365/148
(Continued)

FOREIGN PATENT DOCUMENTS

CN          101636792 A       1/2010
CN          102119424 A       7/2011
(Continued)

OTHER PUBLICATIONS

Japanese Office Action dated Apr. 2, 2019 for corresponding Japanese Application No. 2016-557490.
(Continued)

*Primary Examiner* — Huan Hoang
*Assistant Examiner* — Muna A Techane
(74) *Attorney, Agent, or Firm* — Michael Best & Friedrich LLP

(57) ABSTRACT

A non-volatile memory device of the disclosure includes a memory cell, a writing circuit, and a current controller. The memory cell is disposed at an intersection of a first wiring and a second wiring, and includes a variable resistance element having a resistance state that is variable between a first resistance state and a second resistance state. The writing circuit varies the variable resistance element from the first resistance state to the second resistance state, and thereby performs writing of data on the memory cell. The current controller controls a current and thereby limits the current to a predetermined limit current value. The current is caused to flow through the first wiring or the second wiring by the writing circuit upon performing of the writing of the data. The current controller causes the predetermined limit current value to be a first limit current value in a period before a time at which the variable resistance element is varied to the second resistance state, and varies the prede- (Continued)

termined limit current value from the first limit current value to a second limit current value after the time at which the variable resistance element is varied to the second resistance state.

22 Claims, 20 Drawing Sheets

(52) U.S. Cl.
CPC ...... *G11C 13/0061* (2013.01); *G11C 13/0097* (2013.01); *G11C 2013/0092* (2013.01); *G11C 2213/72* (2013.01)

(58) Field of Classification Search
USPC .......................................................... 365/148
See application file for complete search history.

(56) References Cited

U.S. PATENT DOCUMENTS

| | | | | |
|---|---|---|---|---|
| 2011/0164444 A1* | 7/2011 | Fukano | .............. | G11C 13/0002 365/51 |
| 2011/0210300 A1 | 9/2011 | Savransky et al. | | |
| 2011/0235394 A1* | 9/2011 | Sasaki | ................ | G11C 13/0026 365/148 |
| 2011/0282109 A1 | 11/2011 | Johnston et al. | | |
| 2011/0286260 A1 | 11/2011 | Tsukamoto et al. | | |
| 2013/0188414 A1* | 7/2013 | Kawai | ................ | G11C 13/0069 365/148 |
| 2014/0112055 A1* | 4/2014 | Kawahara | .............. | G11C 13/00 365/148 |
| 2014/0219005 A1* | 8/2014 | Minemura | ......... | G11C 13/0069 365/148 |
| 2014/0321194 A1 | 10/2014 | Sonehara | | |
| 2015/0332764 A1* | 11/2015 | Cabout | .............. | G11C 13/0007 365/148 |

FOREIGN PATENT DOCUMENTS

| | | |
|---|---|---|
| JP | 2009-217908 A | 9/2009 |
| JP | 2011-243265 A | 12/2011 |
| JP | 2013-058779 A | 3/2013 |
| WO | 2007/074504 A1 | 7/2007 |

OTHER PUBLICATIONS

Chinese Office Action dated Mar. 18, 2020 for corresponding Chinese Application No. 201580057970.8.

* cited by examiner

[ FIG. 1 ]
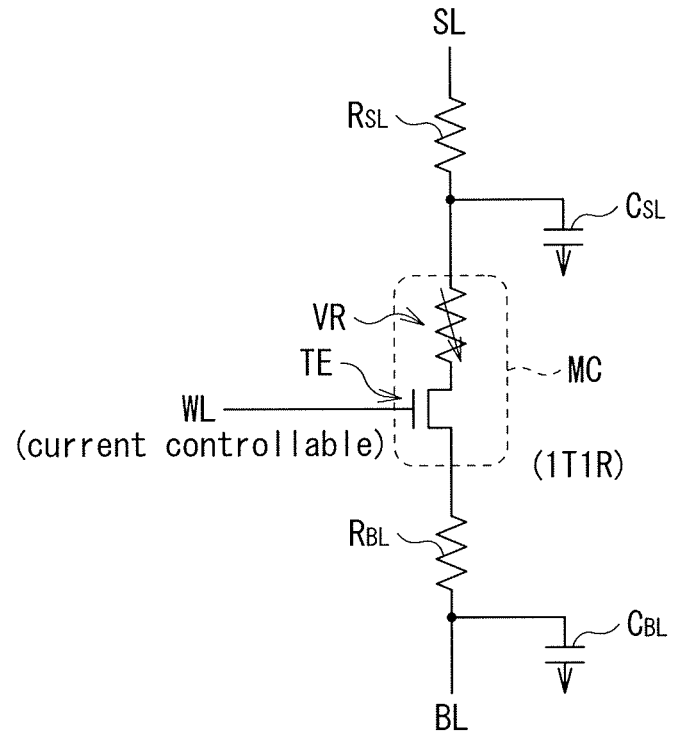
[ FIG. 2 ]
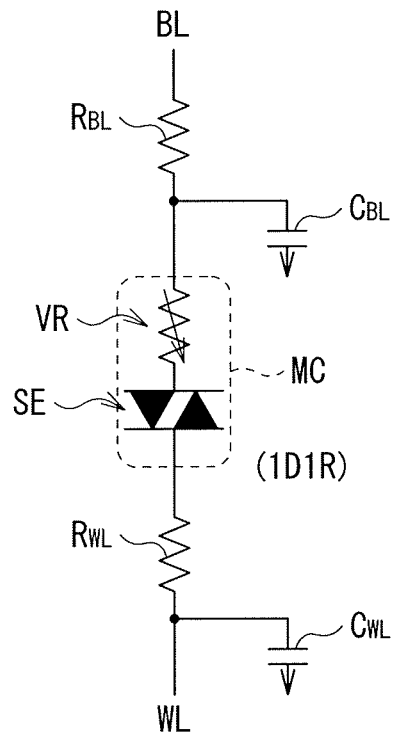

[ FIG. 3 ]
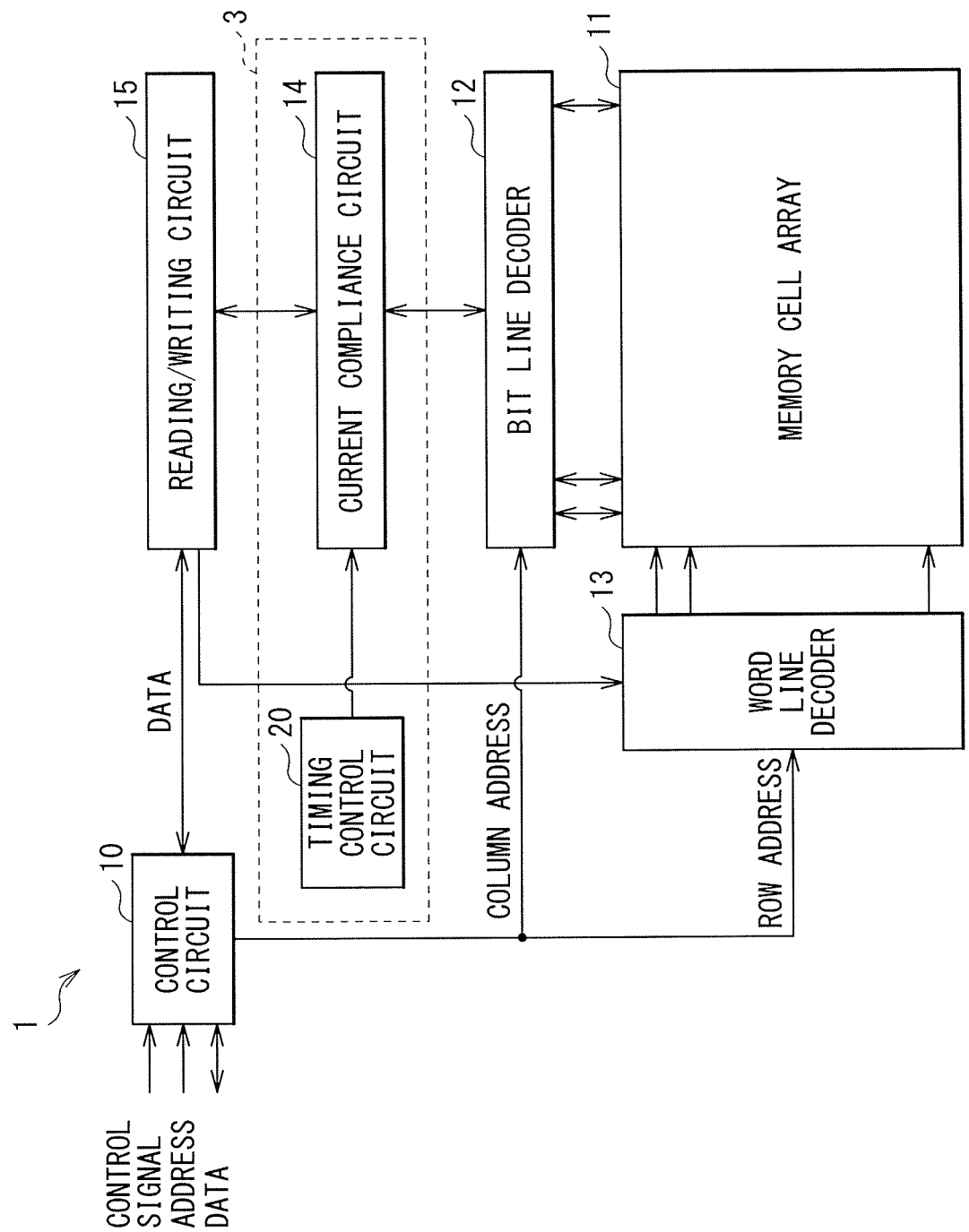

[ FIG. 4 ]
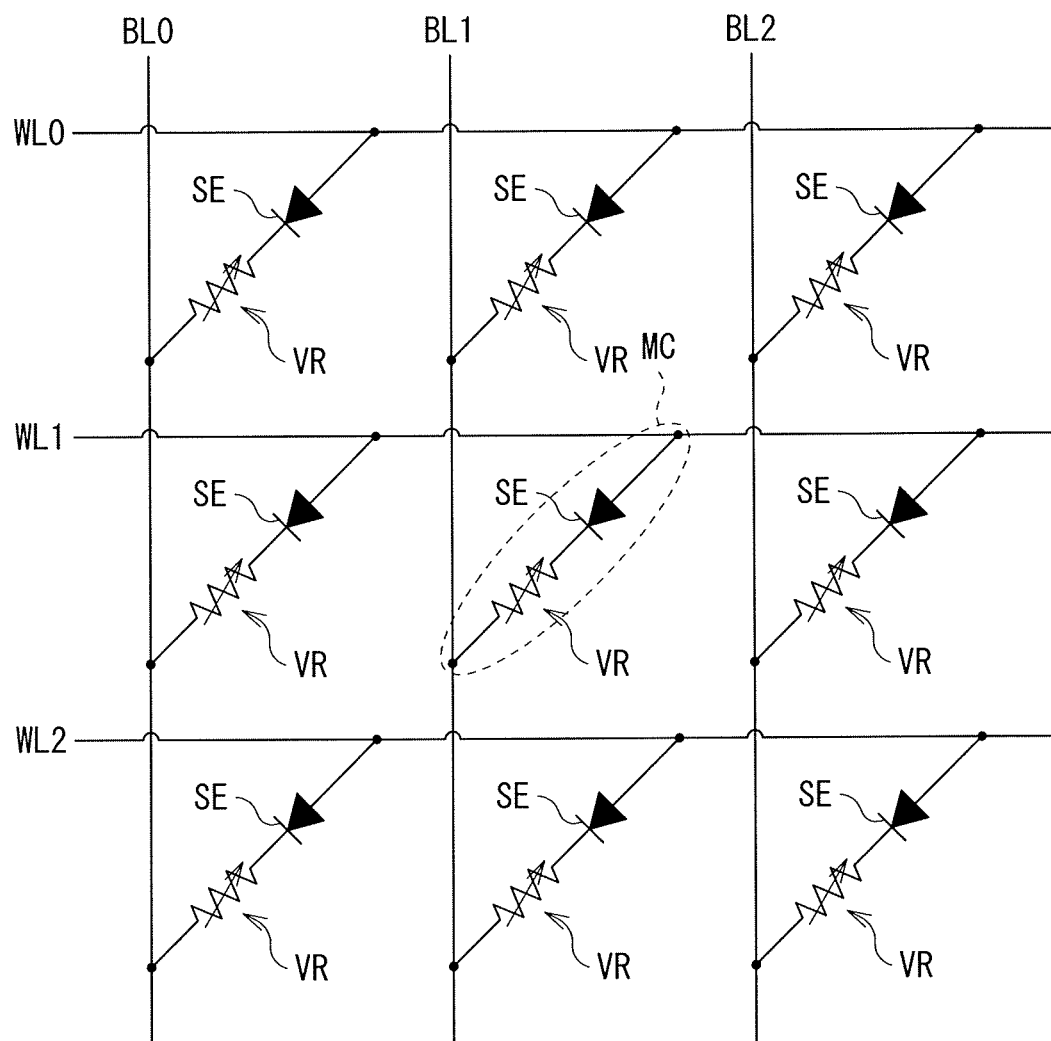

[ FIG. 5 ]
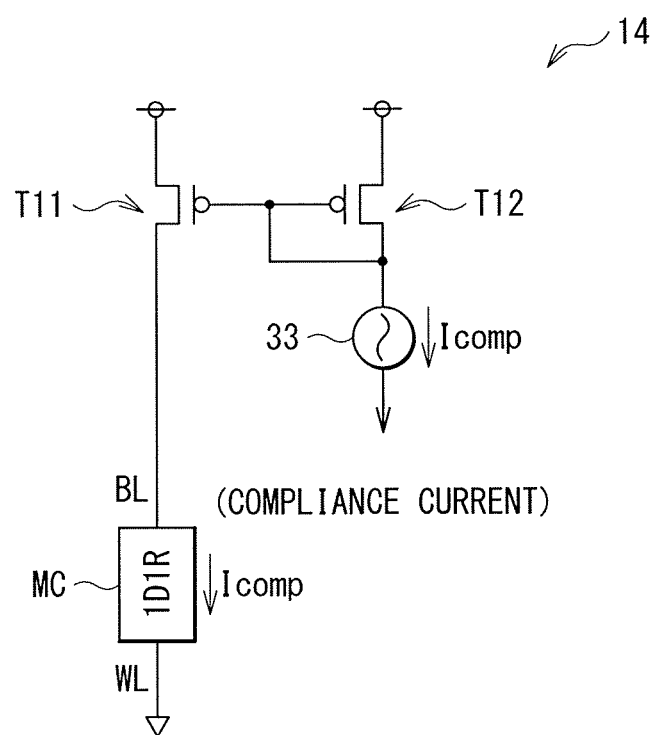

[ FIG. 6 ]
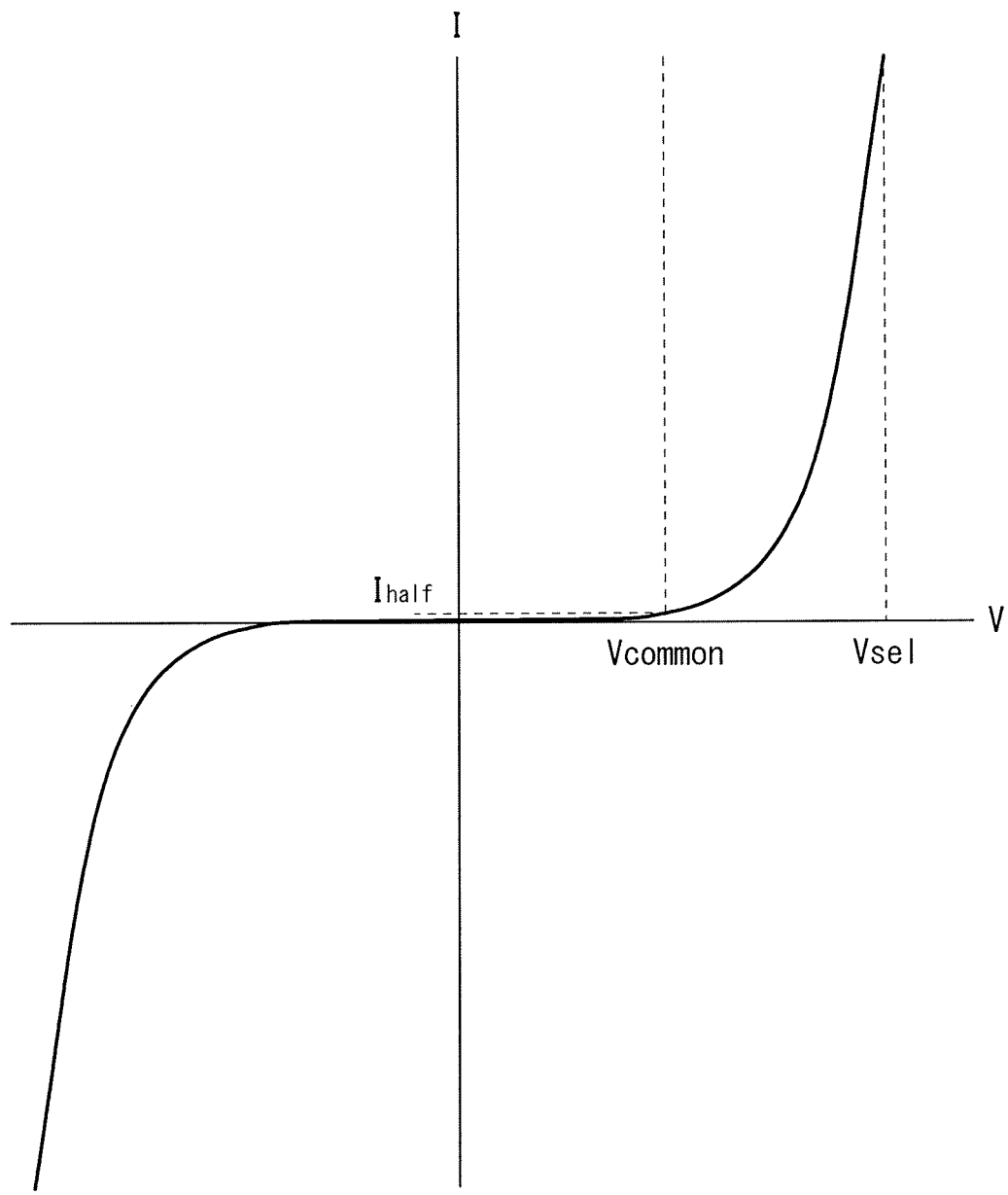

[ FIG. 7 ]
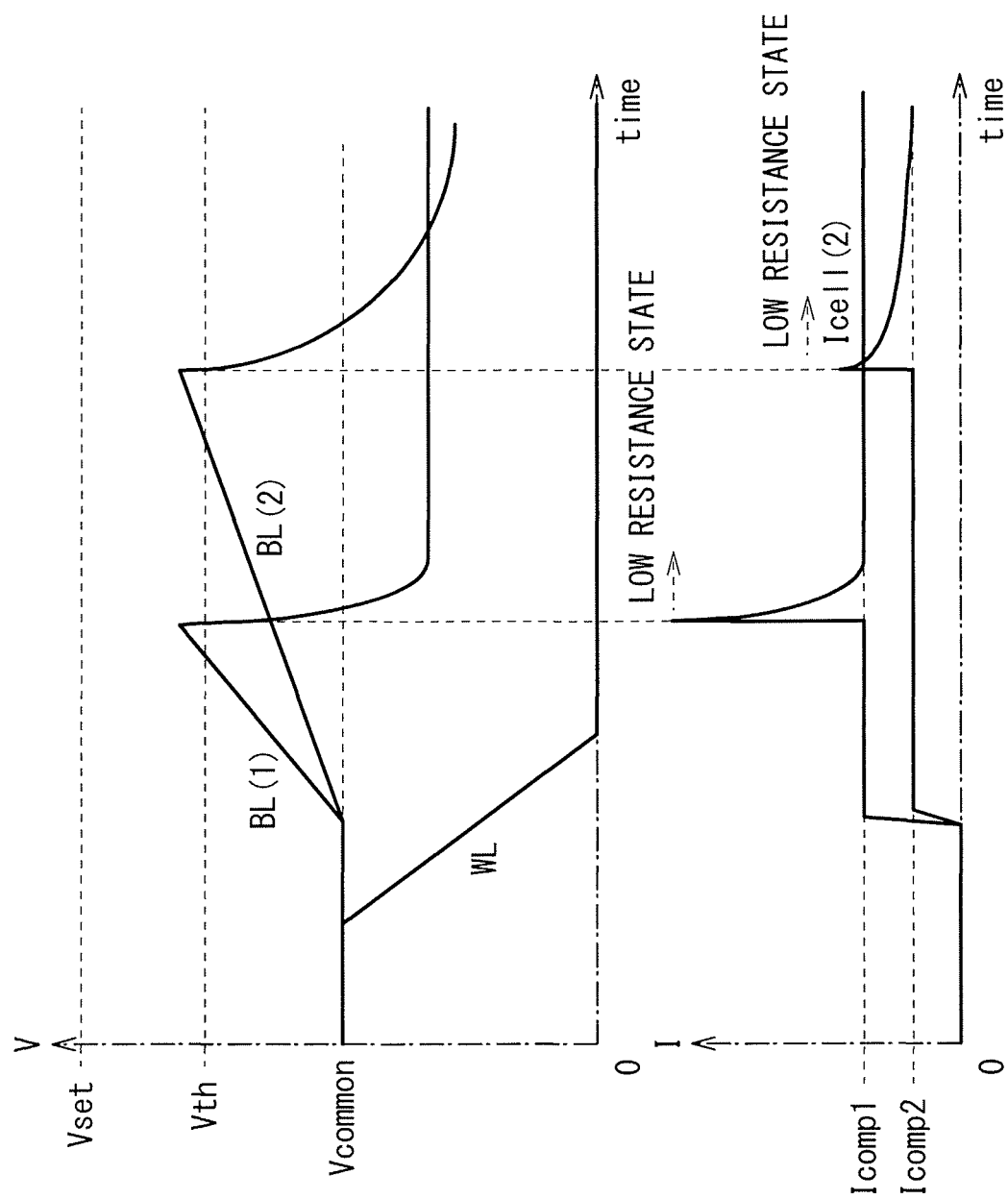

[ FIG. 8 ]
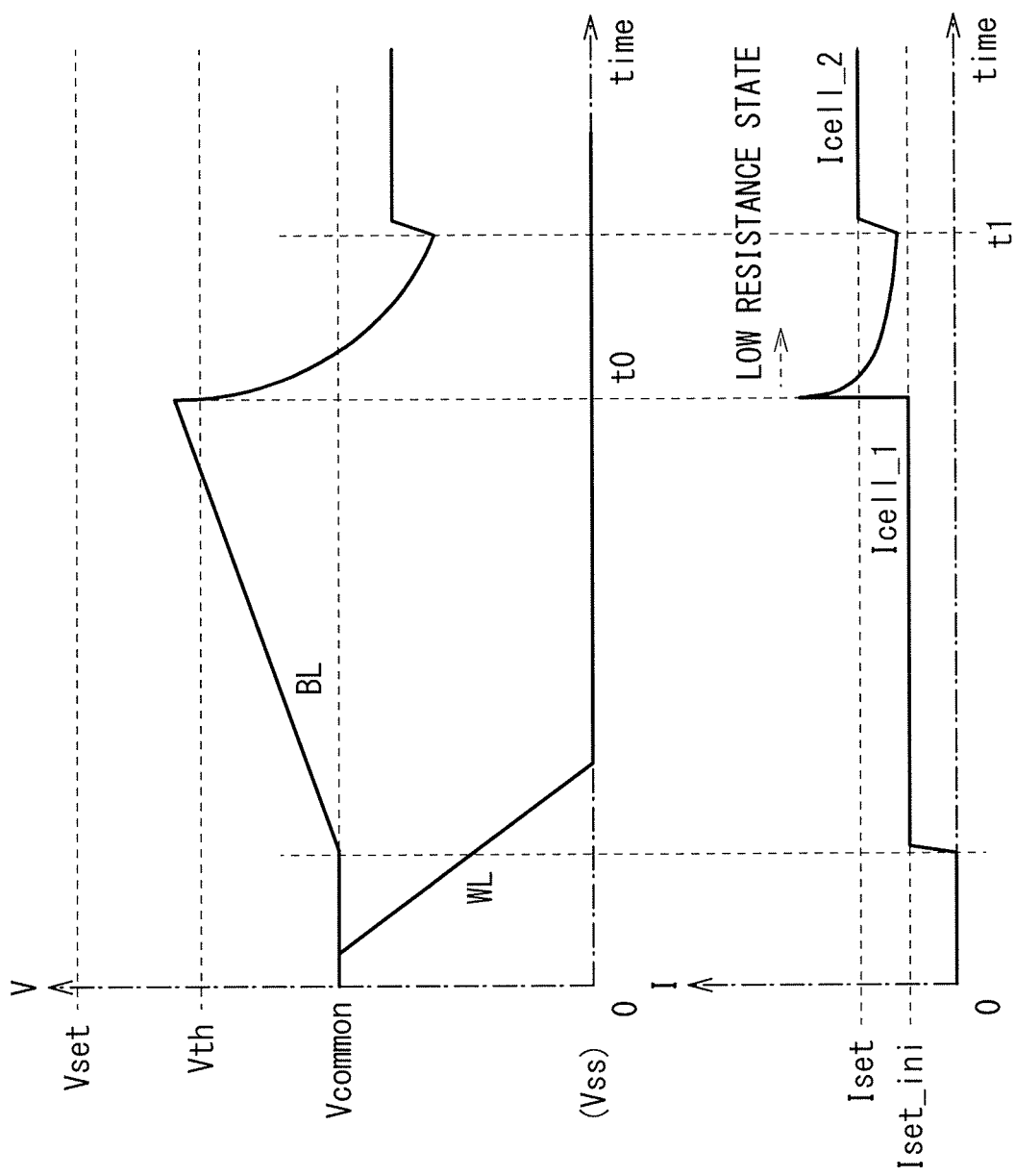

[FIG. 9]
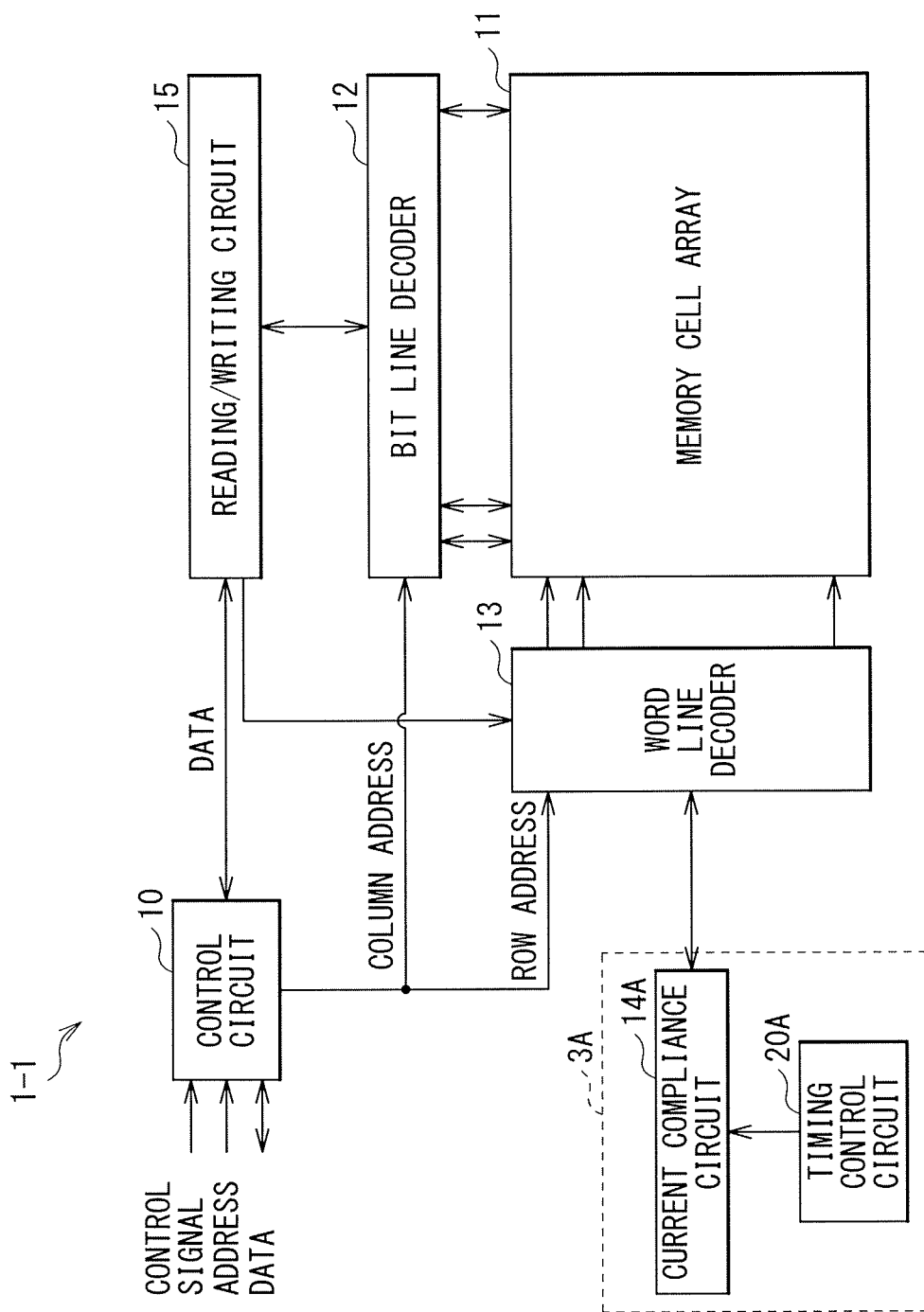

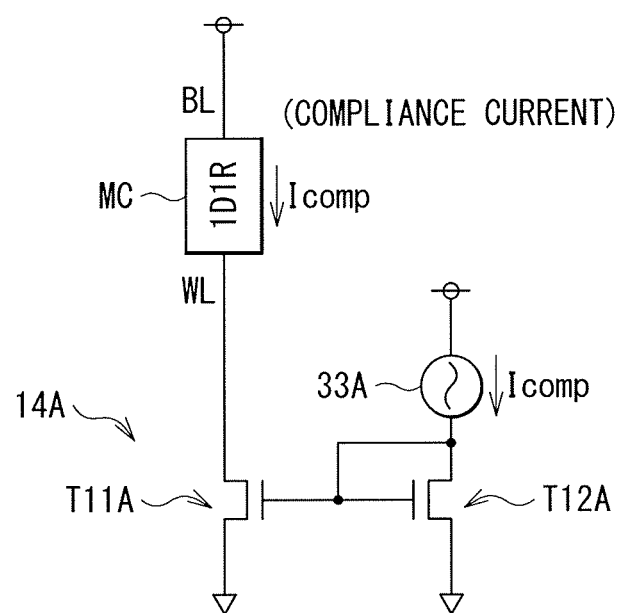
[ FIG. 10 ]

[ FIG. 11 ]
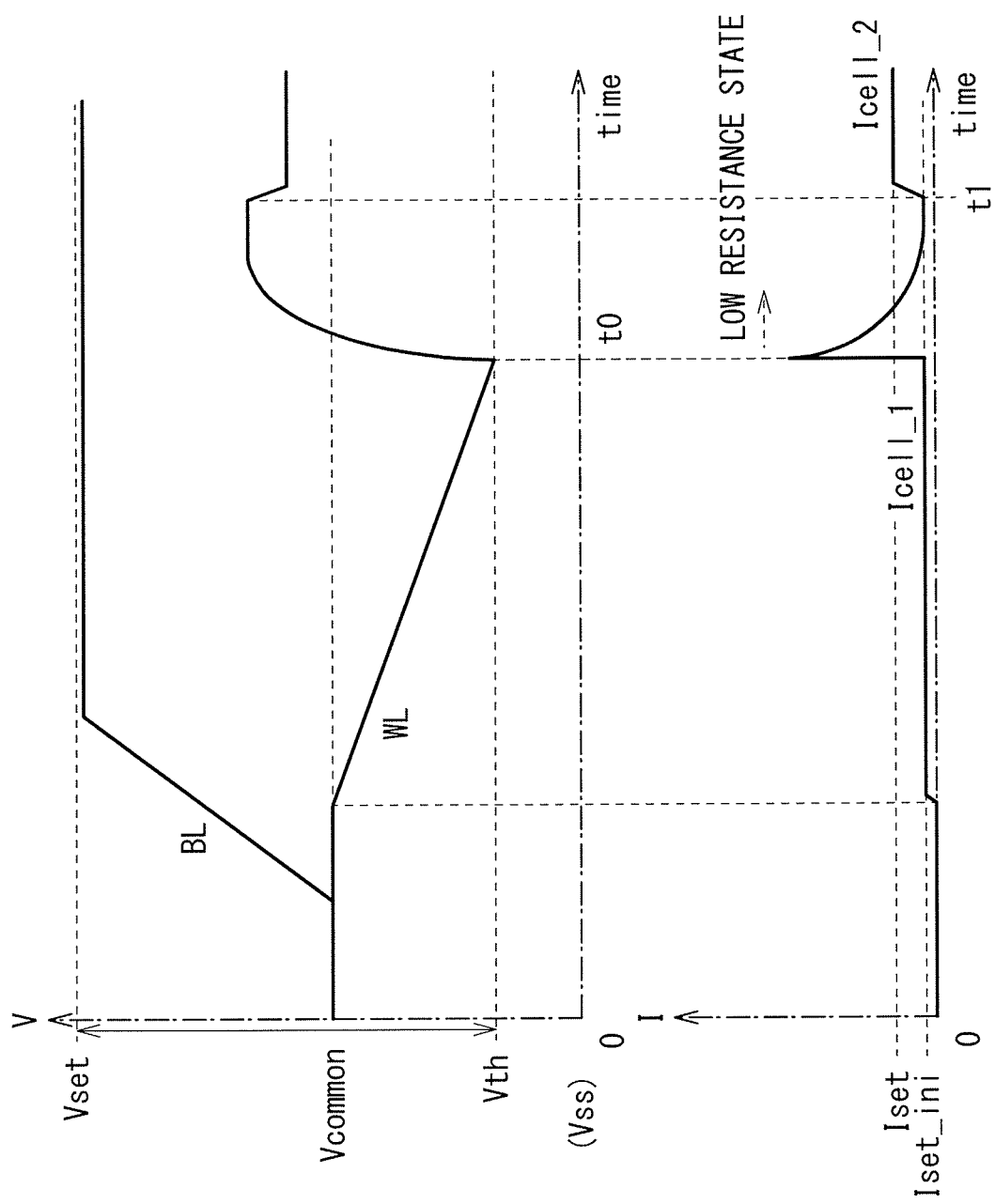

[ FIG. 12 ]
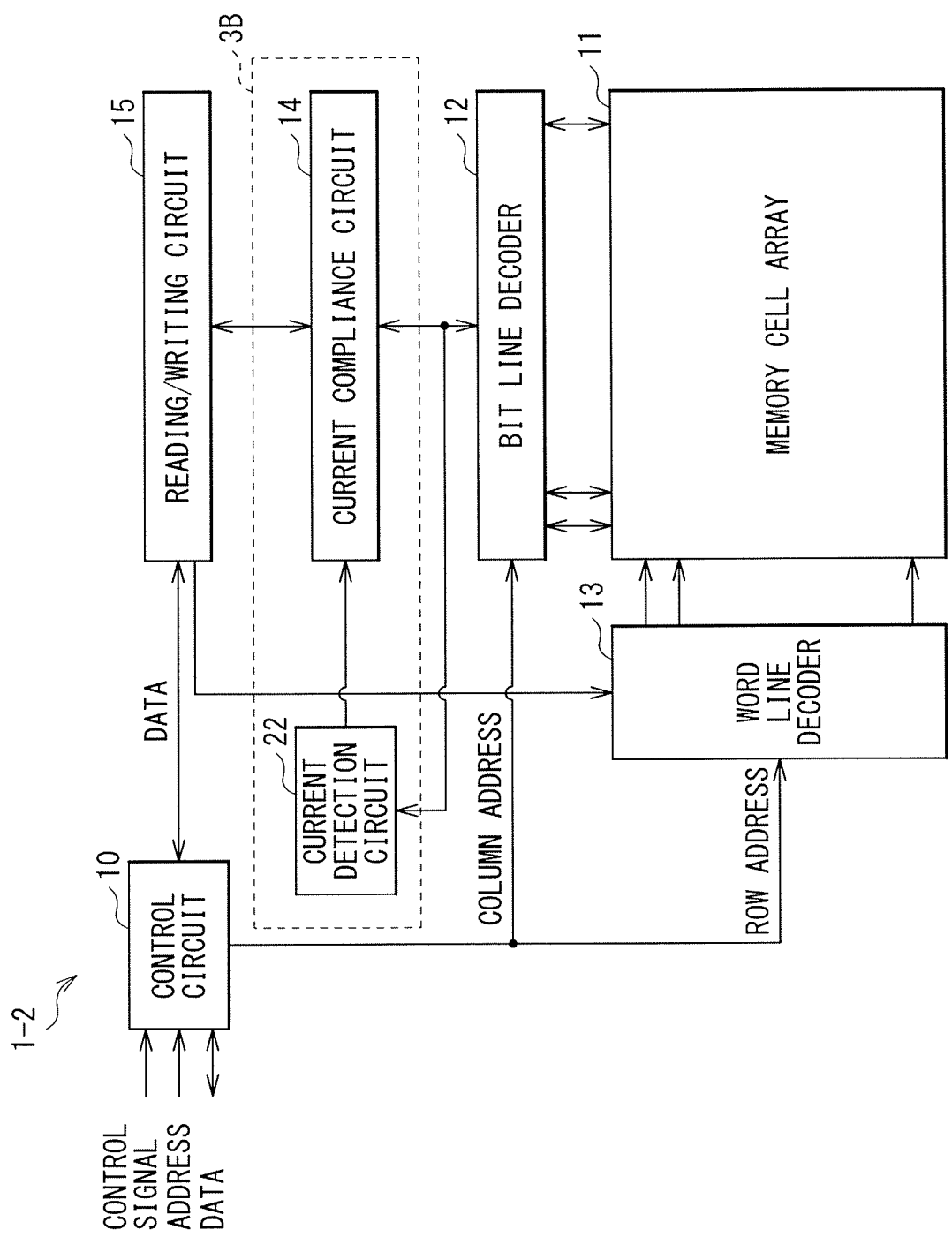

[ FIG. 13 ]
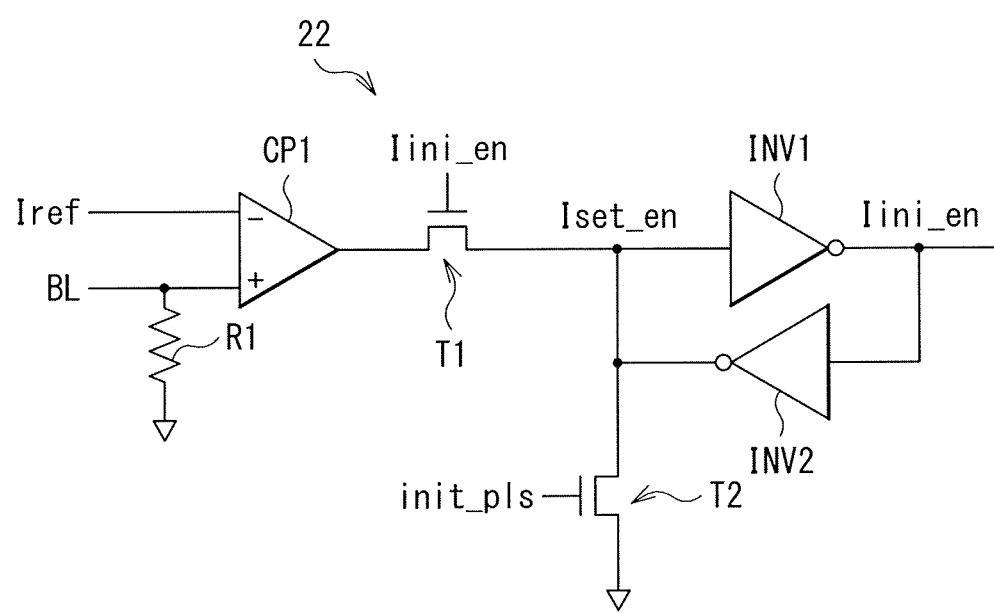

[ FIG. 14 ]
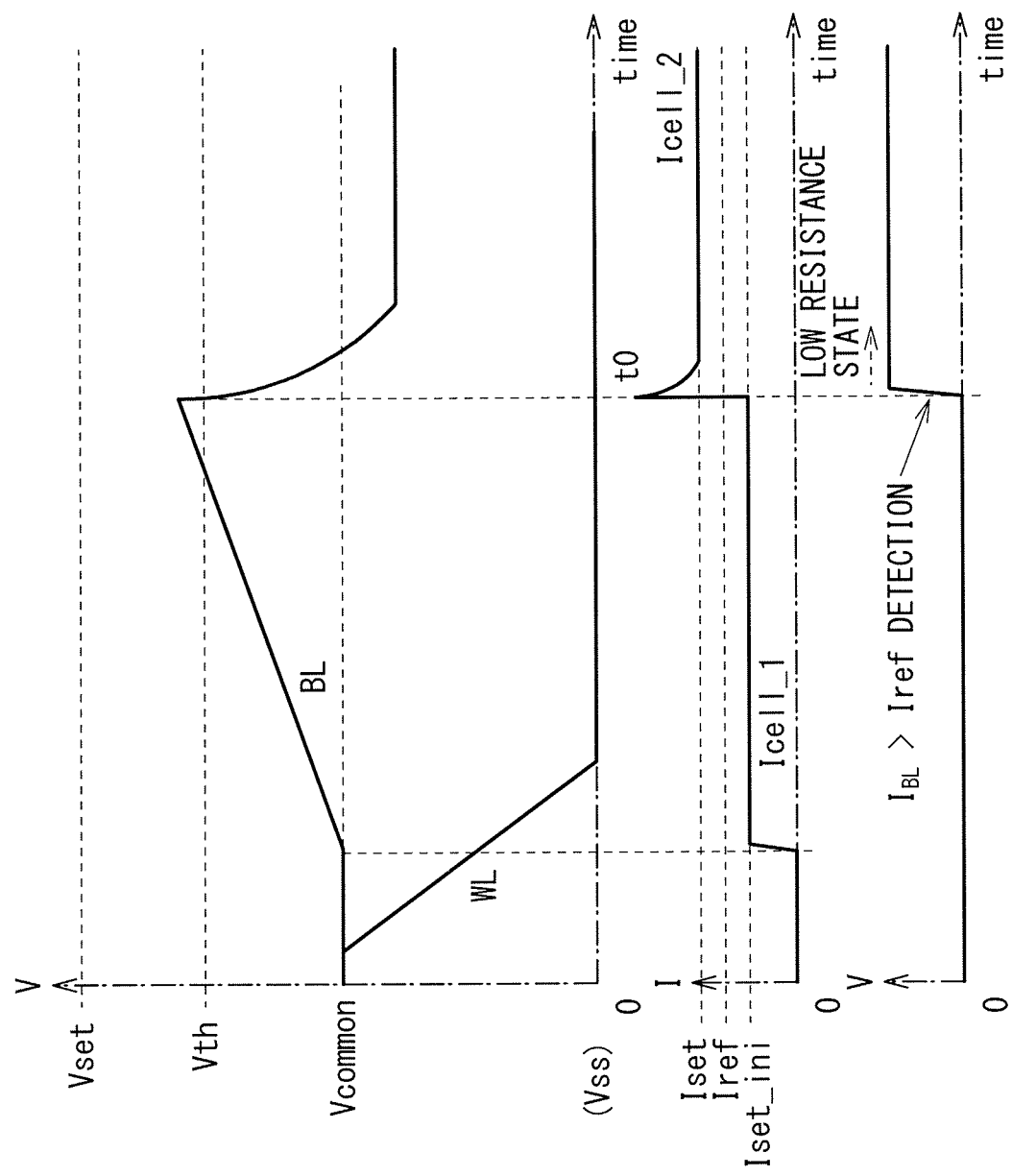

[ FIG. 15 ]
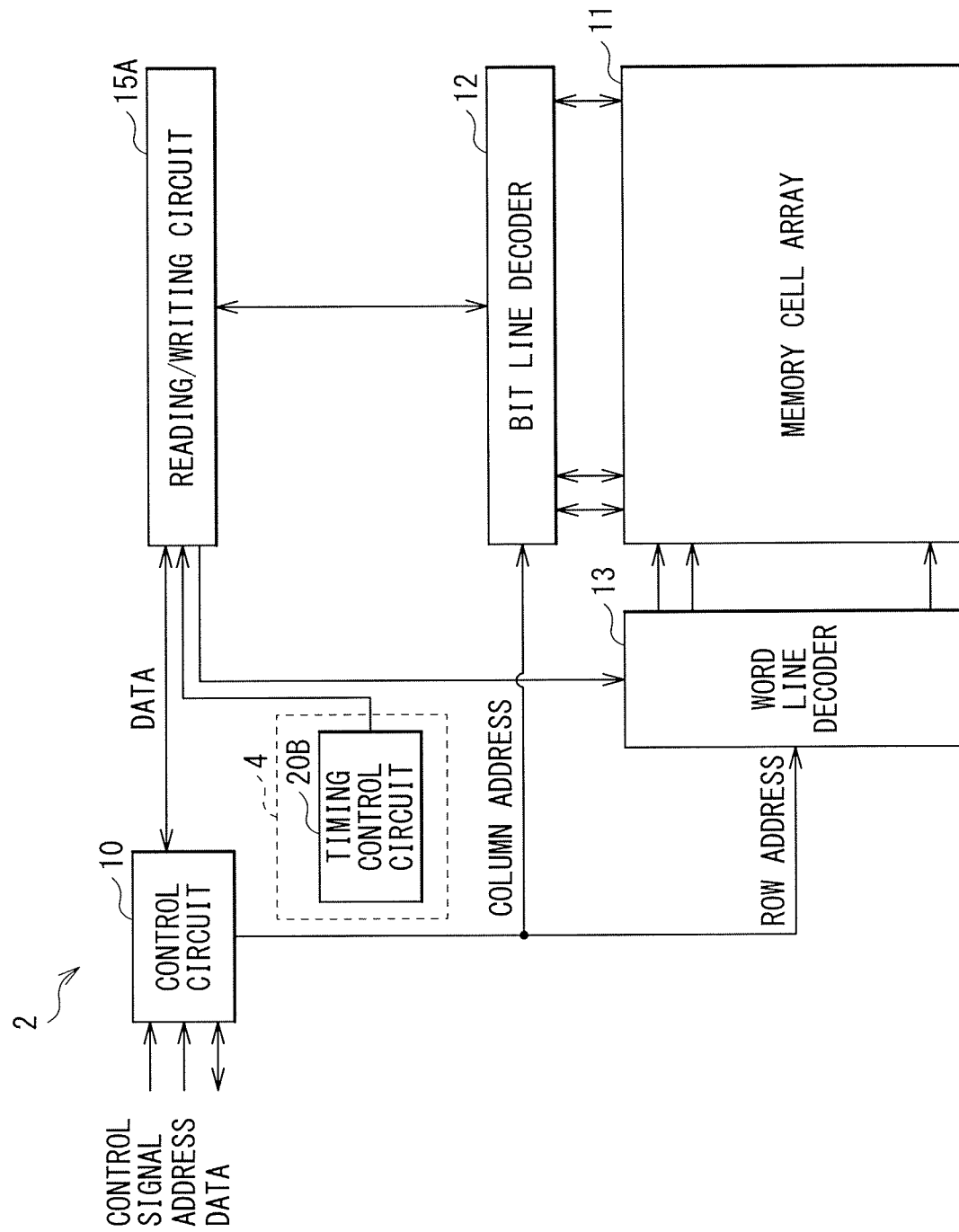

[ FIG. 16 ]
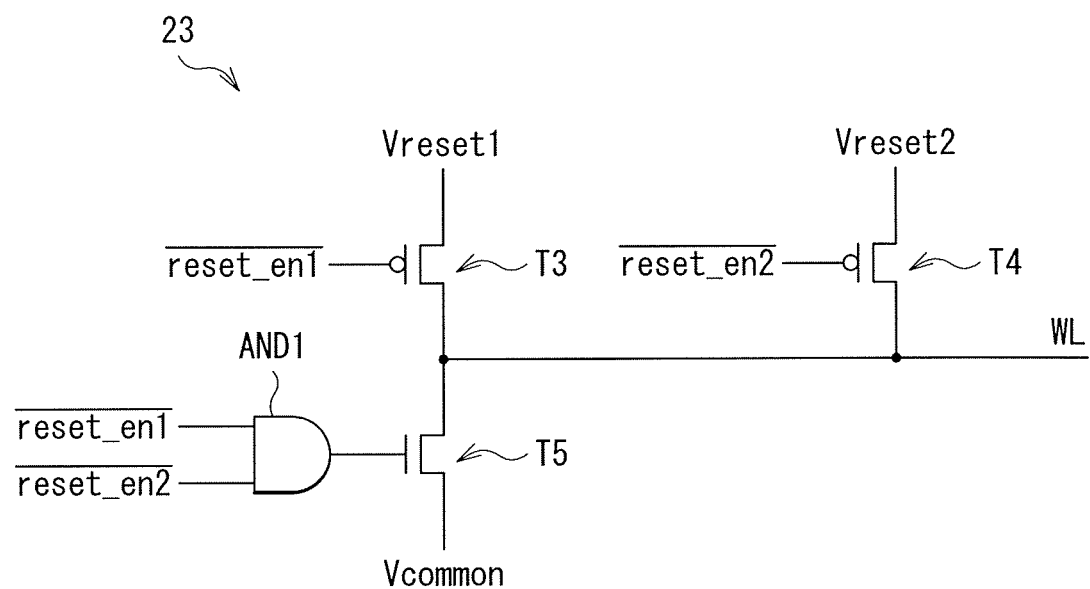

[ FIG. 17 ]
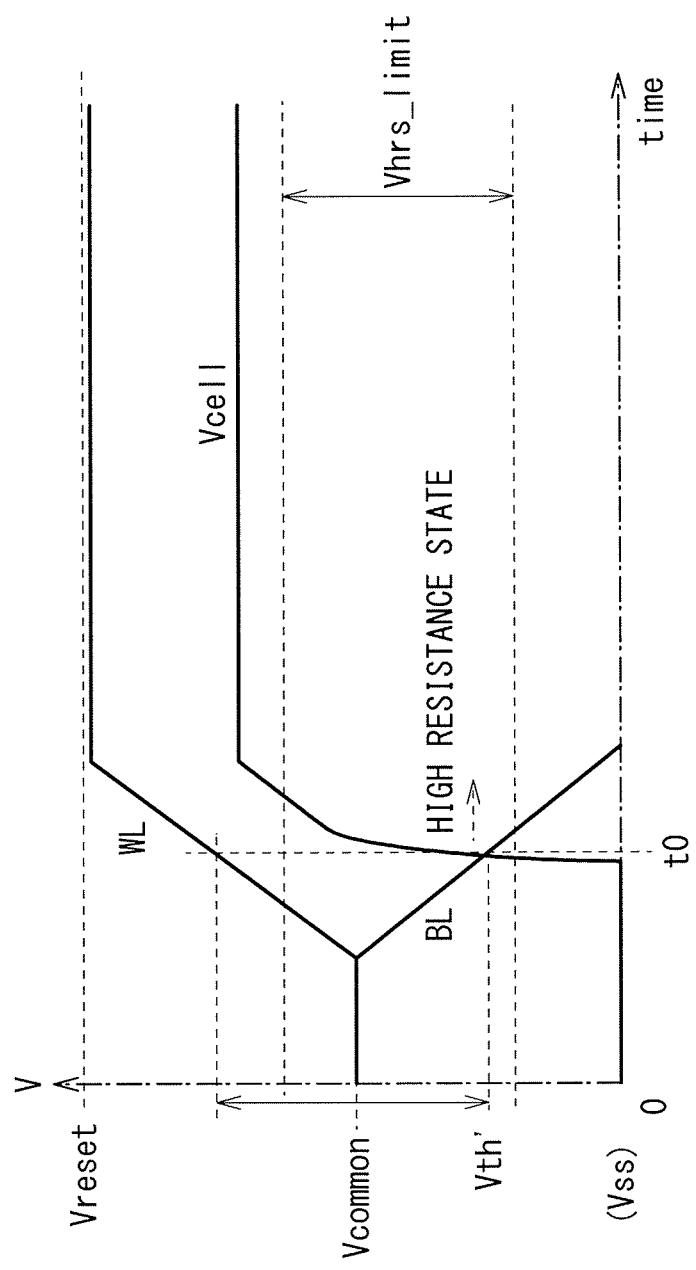

[ FIG. 18 ]
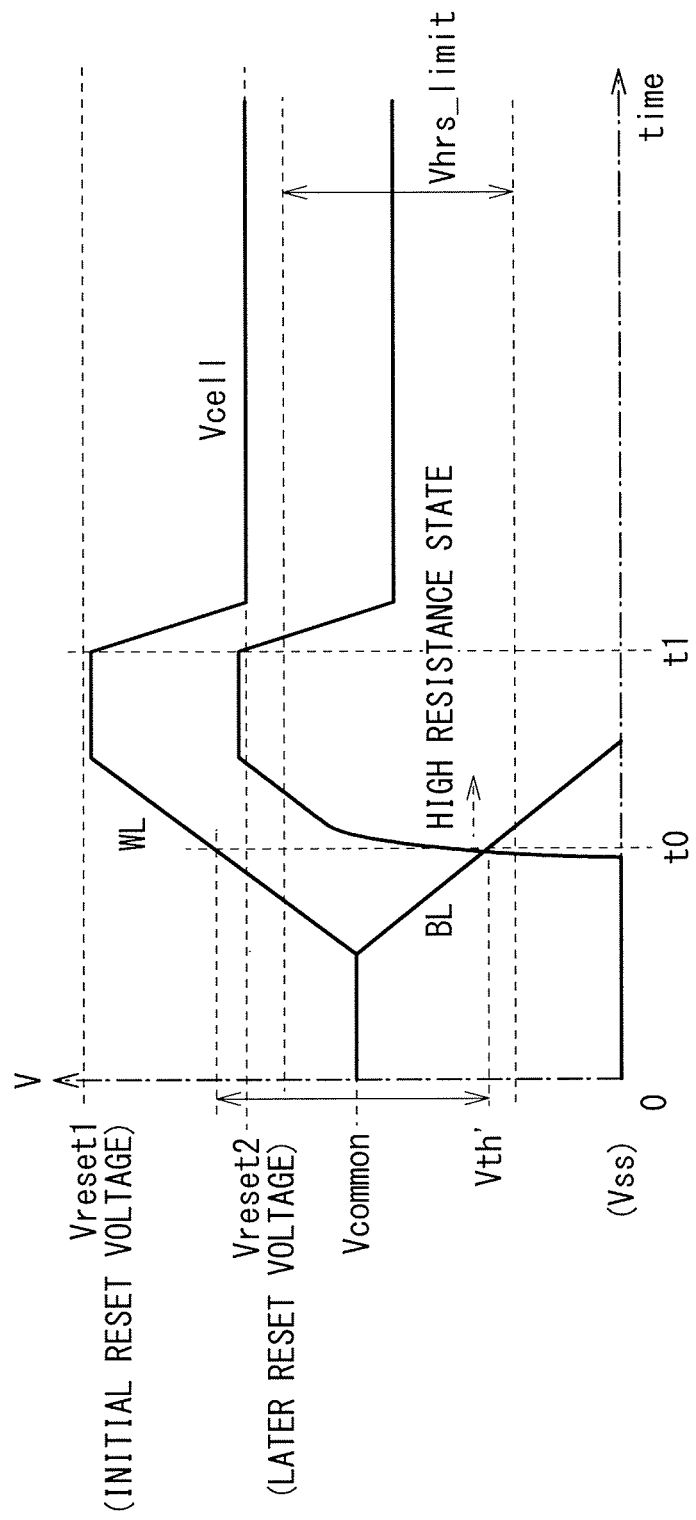

[ FIG. 19 ]
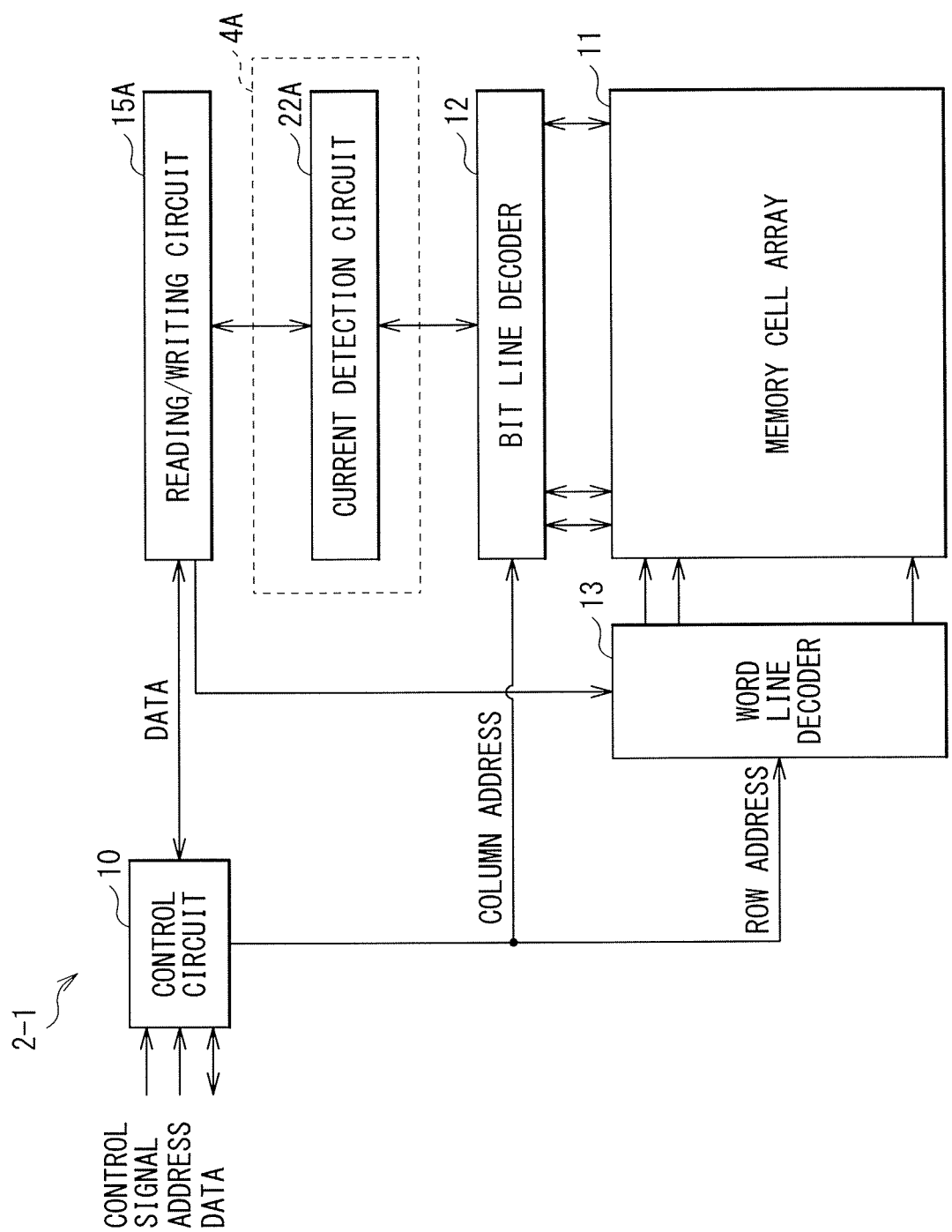

[ FIG. 20 ]
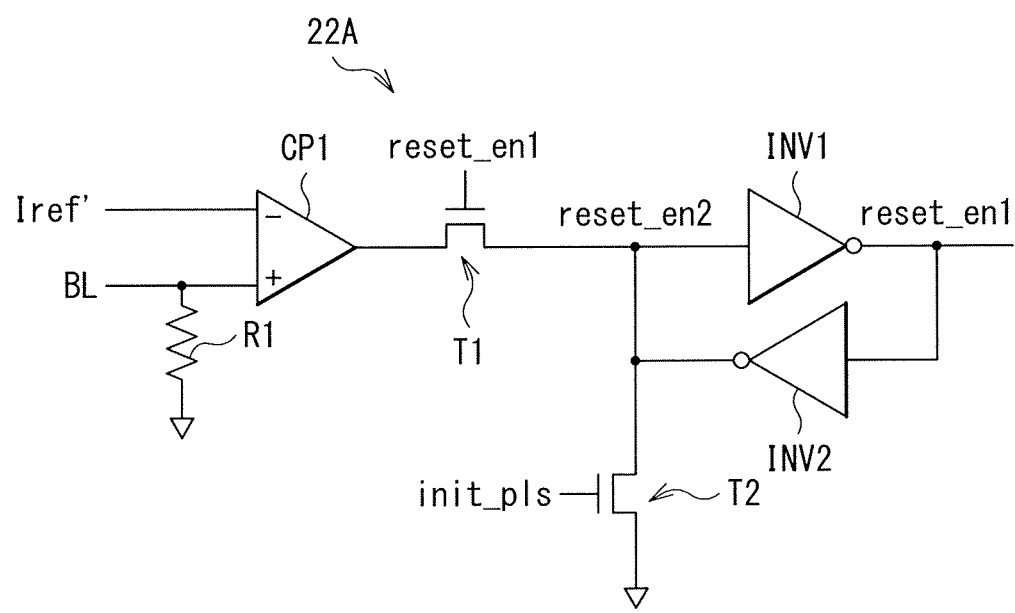

[FIG. 21]
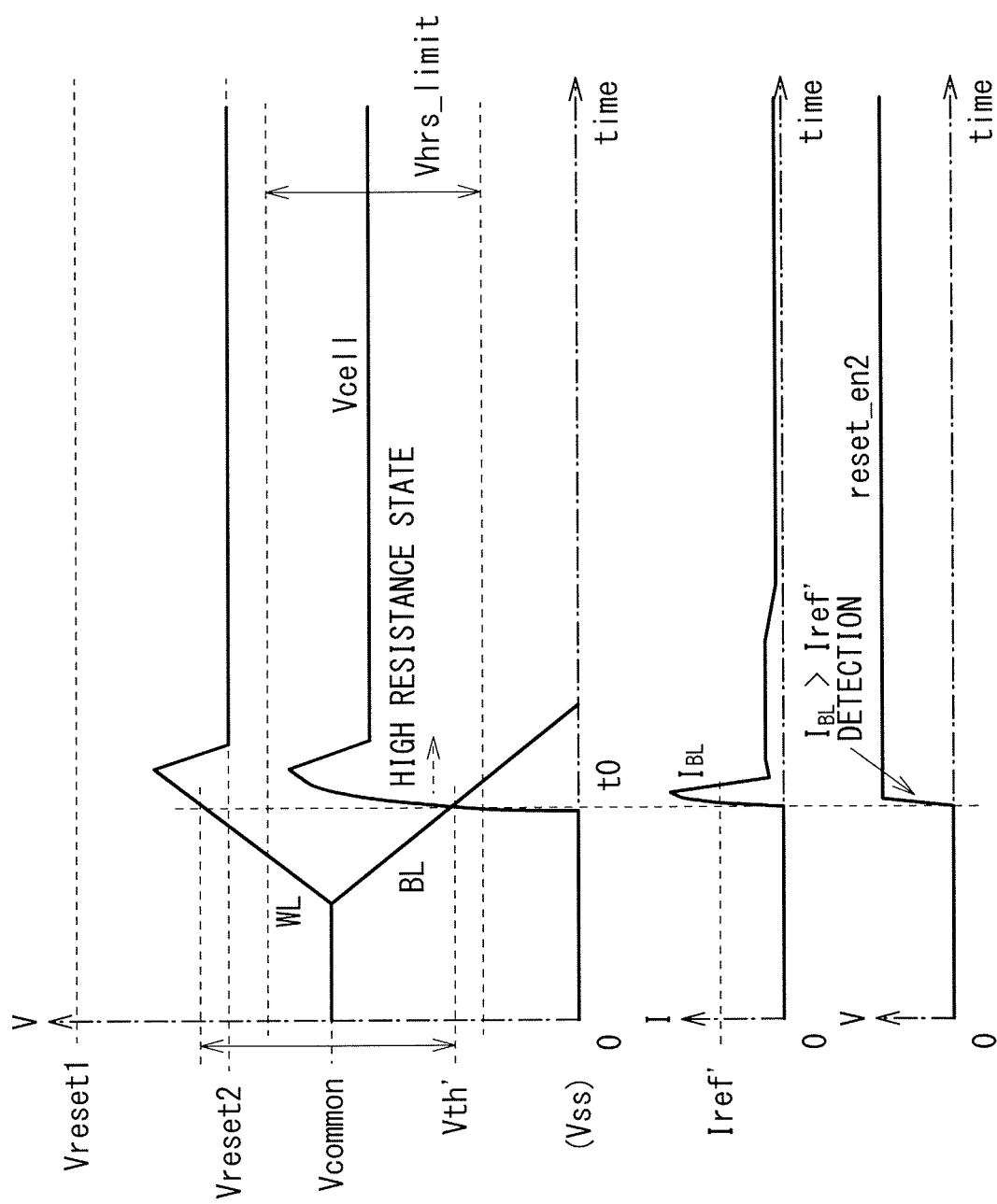

NON-VOLATILE MEMORY DEVICE AND METHOD OF CONTROLLING NON-VOLATILE MEMORY DEVICE

TECHNICAL FIELD

The disclosure relates to a non-volatile memory device that uses a variable resistance element as a non-volatile memory element, and a method of controlling a non-volatile memory device.

BACKGROUND ART

As a non-volatile memory, ReRAM (Resistive Random Access Memory), CBRAM (Conduction Bridge Random Access Memory), PCRAM (Phase-Change Random Access Memory), MRAM (Magnetoresistive Random Access Memory), STTRAM (Spin Transfer Torque Random Access Memory), etc. are known. The ReRAM uses, as a non-volatile memory element, a variable resistance element that stores data owing to variation in resistance state (for example, reference is made to PTLs 1 and 2).

Further, as a configuration of a memory cell using the foregoing non-volatile memory, for example, a 1R (1 Resistor) type and a 1D1R (1 Diode and 1 Resistor) type are known. A cross-point type memory device is known in which such memory cells are disposed at intersections of a plurality of bit lines and a plurality of word lines.

CITATION LIST

Patent Literature

[PTL 1] Japanese Unexamined Patent Application Publication No. 2013-58779
[PTL 2] Japanese Unexamined Patent Application Publication No. 2009-217908

SUMMARY OF THE INVENTION

A cross-point type memory device using a variable resistance element in a memory cell may perform writing of data, for example, by applying a voltage necessary for writing to the memory cell and thereby varying the variable resistance element from a high resistance state to a low resistance state. This writing of data is referred to as "setting". Erasing of data may be performed, for example, by applying a voltage necessary for the erasing to the memory cell and thereby varying the variable resistance element from the low resistance state to the high resistance state. This erasing of the data is referred to as "resetting".

Upon performing of the foregoing writing of the data, it is necessary to appropriately control a current flowing through the memory cell in order to stabilize, for example, characteristics of the memory cell and writing characteristics. Further, upon performing of the foregoing erasing of the data, it is necessary to appropriately control a voltage to be applied to the memory cell in order to stabilize, for example, the characteristics of the memory cell and erasing characteristics.

PTL 1 mentioned above proposes to apply, to the memory cell, a preliminary voltage pulse having a polarity opposite to a polarity of a voltage for varying a resistance upon rewriting of data, and thereby stabilize characteristics in a case where the number of rewriting is increased. However, PTL 1 mentioned above does not take into consideration stabilizing disturbance in characteristics of a current or a voltage that instantly occurs each time the rewriting of data is performed.

Further, PTL 2 mentioned above proposes, for example, to limit a value of a current flowing through the memory cell upon the writing of the data to a predetermined limit value, and to limit a value of a voltage applied to the memory cell upon the erasing of the data to a predetermined limit value. PTL 2 mentioned above proposes to control a current or a voltage instantly upon variation in resistance state. However, this control is not sufficient in order to stabilize not only a state upon the variation in resistance state but also a state after the variation in resistance state.

Accordingly, it is desirable to provide a non-volatile memory device and a method of controlling a non-volatile memory device that makes it possible to stabilize an operation accompanying the variation in resistance.

A non-volatile memory device according to one embodiment of the disclosure includes a memory cell, a writing circuit, and a current controller. The memory cell is disposed at an intersection of a first wiring and a second wiring, and includes a variable resistance element having a resistance state that is variable between a first resistance state and a second resistance state. The writing circuit varies the variable resistance element from the first resistance state to the second resistance state, and thereby performs writing of data on the memory cell. The current controller controls a current and thereby limits the current to a predetermined limit current value. The current is caused to flow through the first wiring or the second wiring by the writing circuit upon performing of the writing of the data. The current controller causes the predetermined limit current value to be a first limit current value in a period before a time at which the variable resistance element is varied to the second resistance state, and varies the predetermined limit current value from the first limit current value to a second limit current value after the time at which the variable resistance element is varied to the second resistance state.

A method of controlling a non-volatile memory device according to one embodiment of the disclosure includes: with a writing circuit, varying a variable resistance element from a first resistance state to a second resistance state, and thereby performing writing of data on a memory cell that is disposed at an intersection of a first wiring and a second wiring, and includes the variable resistance element having a resistance state that is variable between the first resistance state and the second resistance state; and controlling a current, and thereby limiting the current to a predetermined limit current value, the current being caused to flow through the first wiring or the second wiring by the writing circuit upon performing of the writing of the data. As a control of the current, the predetermined limit current value is caused to be a first limit current value in a period before a time at which the variable resistance element is varied to the second resistance state, and the predetermined limit current value is varied from the first limit current value to a second limit current value after the time at which the variable resistance element is varied to the second resistance state.

In the non-volatile memory device or the method of controlling the non-volatile memory device according to the one embodiment of the disclosure, the writing circuit varies the variable resistance element from the first resistance state to the second resistance state, and the writing of the data is thus performed. The current that is caused to flow through the first wiring or the second wiring by the writing circuit upon the writing of the data is limited to the first limit current value in the period before the time at which the variable resistance element is varied to the second resistance state, and is varied to the second limit current value after the time at which the variable resistance element is varied to the second resistance state.

A non-volatile memory device according to another embodiment of the disclosure includes a memory cell, a writing circuit, and a voltage controller. The memory cell is disposed at an intersection of a first wiring and a second wiring, and includes a variable resistance element having a resistance state that is variable between a first resistance state and a second resistance state. The writing circuit varies the variable resistance element from the second resistance state to the first resistance state, and thereby performs erasing of data stored in the memory cell. The voltage controller controls a voltage and thereby limits the voltage to a predetermined limit voltage value. The voltage is to be applied to the second wiring by the writing circuit upon performing of the erasing of the data. The voltage controller causes the predetermined limit voltage value to be a first limit voltage value in a period before a time at which the variable resistance element is varied to the first resistance state, and varies the predetermined limit voltage value from the first limit voltage value to a second limit voltage value after the time at which the variable resistance element is varied to the first resistance state.

A method of controlling a non-volatile memory device according to another embodiment of the disclosure includes: with a writing circuit, varying a variable resistance element from a second resistance state to a first resistance state, and thereby performing erasing of data on a memory cell that is disposed at an intersection of a first wiring and a second wiring, and includes the variable resistance element having a resistance state that is variable between the first resistance state and the second resistance state; and controlling a voltage, and thereby limiting the voltage to a predetermined limit voltage value, the voltage being to be applied to the second wiring by the writing circuit upon performing of the erasing of the data. As a control of the voltage, the predetermined limit voltage value is caused to be a first limit voltage value in a period before a time at which the variable resistance element is varied to the first resistance state, and the predetermined limit voltage value is varied from the first limit voltage value to a second limit voltage value after the time at which the variable resistance element is varied to the first resistance state.

In the non-volatile memory device or the method of controlling the non-volatile memory device according to the another embodiment of the disclosure, the writing circuit varies the variable resistance element from the second resistance state to the first resistance state, and the erasing of the data is thus performed. The voltage that is to be applied to the second wiring by the writing circuit upon the erasing of the data is limited to the first limit voltage value in the period before the time at which the variable resistance element is varied to the first resistance state, and is varied to the second limit voltage value after the time at which the variable resistance element is varied to the first resistance state.

According to the non-volatile memory device or the method of controlling the non-volatile memory device of the one embodiment of the disclosure, the current that is to flow through the first wiring or the second wiring is appropriately limited upon performing of the writing of the data by the writing circuit. It is therefore possible to achieve stabilization upon the writing operation.

According to the non-volatile memory device or the method of controlling the non-volatile memory device of the another embodiment of the disclosure, the voltage that is to be applied to the second wiring is appropriately limited upon performing of the erasing of the data by the writing circuit. It is therefore possible to achieve stabilization upon the erasing operation.

It is to be noted that the effects described above are not necessarily limited. Any of effects described herein may be provided.

BRIEF DESCRIPTION OF DRAWINGS

FIG. 1 is a circuit diagram illustrating a first example of a variable resistance memory element that uses a variable resistance element as a non-volatile memory element.

FIG. 2 is a circuit diagram illustrating a second example of the memory element that uses the variable resistance element as the non-volatile memory element.

FIG. 3 is a configuration diagram illustrating a configuration example of a non-volatile memory device according to a first embodiment of the disclosure.

FIG. 4 is a circuit diagram illustrating a configuration example of a memory cell array.

FIG. 5 is a circuit diagram illustrating a configuration example of a current compliance circuit in the non-volatile memory device illustrated in FIG. 3.

FIG. 6 describes an example of voltage-current characteristics of a selection element.

FIG. 7 describes a difference in peak of a current flowing through the memory cell in a case where a limit current value at a time of a setting operation is varied.

FIG. 8 is a timing chart illustrating an example of the setting operation of the non-volatile memory device illustrated in FIG. 3.

FIG. 9 is a configuration diagram illustrating a configuration example of a non-volatile memory device according to a first modification of the first embodiment.

FIG. 10 is a circuit diagram illustrating a configuration example of a current compliance circuit in the non-volatile memory device illustrated in FIG. 9.

FIG. 11 is a timing chart illustrating an example of a setting operation of the non-volatile memory device illustrated in FIG. 9.

FIG. 12 is a configuration diagram illustrating a configuration example of a non-volatile memory device according to a second modification of the first embodiment.

FIG. 13 is a circuit diagram illustrating a configuration example of a current detection circuit in the non-volatile memory device illustrated in FIG. 12.

FIG. 14 is a timing chart illustrating an example of a setting operation of the non-volatile memory device illustrated in FIG. 12.

FIG. 15 is a configuration diagram illustrating a configuration example of a non-volatile memory device according to a second embodiment.

FIG. 16 is a circuit diagram illustrating a configuration example of a voltage switching circuit in the non-volatile memory device illustrated in FIG. 15.

FIG. 17 is a timing chart illustrating an example of a resetting operation in a comparative example of the non-volatile memory device illustrated in FIG. 15.

FIG. 18 is a timing chart illustrating an example of a resetting operation in the non-volatile memory device illustrated in FIG. 15.

FIG. 19 is a configuration diagram illustrating a configuration example of a non-volatile memory device according to a modification of the second embodiment.

FIG. 20 is a circuit diagram illustrating a configuration example of a current detection circuit in the non-volatile memory device illustrated in FIG. 19.

FIG. 21 is a timing chart illustrating an example of a resetting operation in the non-volatile memory device illustrated in FIG. 19.

MODES FOR CARRYING OUT THE INVENTION

Some embodiments of the disclosure are described below in detail referring to the drawings. It is to be noted that the description is given in the following order.
0. Description of Variable Resistance Memory Element
    0.1 Configuration (FIGS. 1 and 2)
    0.2 Problem
1. First Embodiment (A Non-Volatile Memory Device that Stabilizes a Setting Operation by Controlling a Current Flowing Through a Bit Line) (FIGS. 3 to 8)
    1.1 Configuration
        1.1.1 Overall Configuration Example of Non-volatile Memory Device (FIGS. 3 and 4)
        1.1.2 Configuration Example of Current Compliance Circuit (FIG. 5)
    1.2 Operation
        1.2.1 Setting Operation (FIGS. 6 to 8)
    1.3 Effect
2. First Modification of First Embodiment (A non-volatile memory device that stabilizes a setting operation by controlling a current flowing through a word line) (FIGS. 9 to 11)
    2.1 Configuration
        2.1.1 Overall Configuration Example of Non-volatile Memory Device (FIG.
        2.1.2 Configuration Example of Current Compliance Circuit (FIG. 10)
    2.2 Operation
        2.2.1 Setting Operation (FIG. 11)
    2.3 Effect
3. Second Modification of First Embodiment (A non-volatile memory device that stabilizes a setting operation by a current detection control) (FIGS. 12 to 14)
    3.1 Configuration
        3.1.1 Overall Configuration Example of Non-volatile Memory Device (FIG.
        3.1.2 Configuration Example of Current Detection Circuit (FIG. 13)
    3.2 Operation
        3.2.1 Setting Operation (FIG. 14)
    3.3 Effect
4. Second Embodiment (A non-volatile memory device that stabilizes a resetting operation by a timing control) (FIGS. 15 to 18)
    4.1 Configuration
        4.1.1 Overall Configuration Example of Non-volatile Memory Device (FIG.
        4.1.2 Configuration Example of Voltage Switching Circuit (FIG. 16)
    4.2 Operation
        4.2.1 Resetting Operation (FIGS. 17 and 18)
    4.3 Effect
5. Modification of Second Embodiment (A non-volatile memory device that stabilizes a resetting operation by a current detection control) (FIGS. 19 to 21)
    5.1 Configuration
        5.1.1 Overall Configuration Example of Non-volatile Memory Device (FIG.
        5.1.2 Configuration Example of Current Detection Circuit (FIG. 20)
    5.2 Operation
        5.2.1 Resetting Operation (FIG. 21)
    5.3 Effect
6. Other Embodiments

0. Description of Variable Resistance Memory Element

[0.1 Configuration]

FIG. 1 illustrates a first example of a variable resistance memory element that uses a variable resistance element VR as a non-volatile memory element. FIG. 2 illustrates a second example of the variable resistance memory element.

The variable resistance memory element illustrated in FIG. 1 may have a structure that includes a memory cell MC of a 1T1R (1 Transistor and 1 Resistor) type that has the variable resistance element VR and a three-terminal MOS (Metal Oxide Semiconductor) transistor TE. A gate terminal of the MOS transistor TE may be coupled to a word line WL, a drain terminal thereof may be coupled to a bit line BL, and a source terminal thereof may be coupled to a source line SL via the variable resistance element VR. Wiring resistances $R_{BL}$ and $R_{SL}$ may be present in the bit line BL and the source line SL, respectively. Parasitic capacitances $C_{BL}$ and $C_{SL}$ may be also present in the bit line BL and the source line SL, respectively.

In a case where a memory cell array is provided using the variable resistance memory elements of the 1T1R type, three wirings, i.e., the bit line BL, the word line WL, and the source line SL may be necessary. This makes it difficult to achieve high-density arrangement of the memory cells MC which is an advantage in a cross-point type memory device. In the 1T1R type, a current value of the memory cell MC may be controllable with the word line WL. This makes it possible to suppress variation in voltage in the bit line BL and the word line WL upon variation in resistance of the variable resistance element VR.

The variable resistance memory element illustrated in FIG. 2 may have a structure that includes a memory cell MC of a 1S1R (1 Selector and 1 Resistor) type that has the variable resistance element VR and a selection element SE that are coupled to each other in series. It is to be noted that FIG. 2 illustrates a structure of the memory cell MC of the 1D1R (1 Diode and 1 Resistor) type using a diode as the selection element SE, as the memory cell MC of the 1S1R type.

The cross-point type memory device may be provided by disposing the foregoing memory cells MC of the 1D1R type at intersections of a plurality of bit lines BL and a plurality of word lines WL. In such a cross-point type memory device, the bit line BL may be coupled to one end of the variable resistance element VR, and the word line WL may be coupled to one end of the selection element SE. Wiring resistances $R_{BL}$ and $R_{WL}$ may be present in the bit line BL and the word line WL, respectively. Parasitic capacitances $C_{BL}$ and $C_{WL}$ may be also present in the bit line BL and the word line WL, respectively.

In the variable resistance memory element, a resistance state of the variable resistance element VR may be varied between a high resistance state and a low resistance state. Data values to be stored may differ between the resistance states. For example, the data value may be "0" for the high resistance state, and may be "1" for the low resistance state.

[0.2 Problem]

In the cross-point type memory device, two-terminal selection element SE is often used instead of the three-terminal MOS transistor TE as the selection element SE as with the 1D1R type in order to achieve a memory cell array with high density. Accordingly, the selection element SE does not have a function of limiting a current.

(Problem upon Setting Operation)

In the 1D1R type, the selection element SE is not able to perform a control of a current that is necessary upon a writing (setting) operation which is generally performed in the memory cell MC of the 1T1R type. Therefore, it is necessary to perform the control of the current with a terminal of the bit line BL or the word line WL in the 1D1R type. Accordingly, in the 1D1R type, a transfer of an electric charge accumulated in the capacitance of the bit line BL or the word line WL may be performed via the memory cell MC when the variable resistance element VR is varied from the high resistance state to the low resistance state. At this time, an excessive transient current may flow through the variable resistance element VR. This may break the variable resistance element VR or may degrade characteristics, for example.

(Problem upon Resetting Operation)

In the variable resistance memory element, two types of voltages, i.e., a voltage Vth and a voltage Vhrs_limit may be used upon a erasing (resetting) operation. The voltage Vth may be provided for causing a current, which is necessary for inverting the resistance state of the variable resistance element VR in the low resistance state, to flow. The voltage Vhrs_limit may have a certain range and may be necessary for stabilizing characteristics in the high resistance state after the variable resistance element VR is varied to the high resistance state.

When the voltage Vhrs_limit having the predetermined range for stabilizing the characteristics in the high resistance state is lower than the predetermined range, a resistance value of the variable resistance element VR may become lower than a desirable value. When the voltage Vhrs_limit is higher than the predetermined range, the variable resistance element VR may be degraded or broken. In a case where a certain constant voltage is applied to the memory cell MC upon the resetting operation, a voltage out of the foregoing predetermined range may be applied to the variable resistance element VR after being varied to the high resistance state. Further, the range of the voltage that is necessary for stabilizing the characteristics in the high resistance state may vary in a lot of ways depending on variations in temperature characteristics of the memory cell MC, variations in any other characteristics, variations in application voltage, etc. It is therefore necessary to apply a voltage that falls within a limited voltage range that covers all of the foregoing variations.

For the variable resistance memory element, there is a voltage range that is necessary for stabilizing the characteristics in the high resistance state after the memory cell MC is varied to the high resistance state upon the resetting operation as described above. However, in a case of using an element having snap characteristics as the selection element SE, it is necessary, in general, to apply a higher voltage to the memory cell MC in order to cause the selection element SE to snap in a process of the foregoing operation owing to the snap characteristics.

When the selection element SE is brought to a snap voltage, the current flowing through the memory cell MC is radically increased, and a voltage applied to the variable resistance element VR is instantly increased. This may cause application of an excessive voltage to the memory cell MC in the high resistance state after the resetting.

Moreover, similarly to the above description, the voltage range may involve variations in a lot of ways due to, for example, variations in characteristics of the memory cell MC, variations in temperature characteristics of the memory cell MC, variations in application voltage, etc. Therefore, it is necessary to control the voltage in a narrower range in the case where the element having the snap characteristics is used as the selection element SE in the cross-point type memory device.

1. First Embodiment

A non-volatile memory device using the variable resistance memory element of the 1D1R type described above is described as an example in the present embodiment.

[1.1 Configuration]

[1.1.1 Overall Configuration Example of Non-volatile Memory Device]

FIG. 3 illustrates an example of an overall configuration of a non-volatile memory device 1 according to a first embodiment of the disclosure. This non-volatile memory device 1 may include a current controller 3, a control circuit 10, a memory cell array 11, a bit line decoder 12, a word line decoder 13, and a reading/writing circuit 15. The current controller 3 may include a current compliance circuit 14 and a timing control circuit 20.

The memory cell array 11 may be a cross-point type memory cell array in which the memory cells MC are so disposed at respective intersections of a plurality of bit lines BL and a plurality of word lines WL that the memory cells MC are disposed perpendicularly. The memory cells MC each may include the non-volatile variable resistance element VR and a two-terminal selection element SE that are coupled in series to each other. FIG. 4 illustrates an equivalent circuit diagram thereof. FIG. 4 illustrates an example in which the memory cells MC are disposed at intersections of three bit lines BL0, BL1, and BL2 and three word lines WL0, WL1, and WL2. However, the number of each of the bit line BL, the word line WL, and the memory cell MC is not limited to that in the illustrated example.

The memory cell array 11 may allow for writing of data on the memory cell MC that is designated by an external address input. The memory cell array 11 may also allow for reading of the data stored in the memory cell MC that is designated by an address input. Data values stored in the memory cell MC may be distinguished on the basis of the resistance state of the variable resistance element VR. For example, the data value may be "0" for the high resistance state, and may be "1" for the low resistance state.

The control circuit 10 may receive a signal such as a control signal supplied from outside and a signal designating an address. Further, the control circuit 10 and the reading/writing circuit 15 may receive or output reading data and writing data. The reading/writing circuit 15 may perform operations of writing of data that is to be stored in the memory cell array 11 and reading of data stored in the memory cell array 11.

The bit line decoder 12 may be coupled to each of the bit lines BL of the memory cell array 11. The bit line decoder 12 may select, on the basis of a column address inputted from an address line, a bit line BL (a selected bit line) corresponding to the column address. Further, all of the bit lines BL that are not selected at this time may be referred to as non-selected bit lines.

The word line decoder 13 may be coupled to each of the word lines WL of the memory cell array 11. The word line decoder 13 may select, on the basis of a row address inputted from the address line, a word line WL (a selected word line) corresponding to the row address. Further, all of the word lines WL that are not selected at this time may be referred to as non-selected word lines.

The reading/writing circuit 15 may include a circuit that drives the bit line BL writing the data "1" to a predetermined voltage (a set voltage) necessary for the setting operation, when an operation of writing the data "1" is performed, i.e., when a writing (setting) operation is performed that varies the variable resistance element VR of the memory cell MC from the first resistance state (the high resistance state) to the second resistance state (the low resistance state).

The current controller 3 may so control a current that is to flow through the bit line BL that the current that is caused to flow through the first wiring (the bit line BL) by the reading/writing circuit 15 upon performing of the writing of the data is limited to a predetermined limit current value. The current controller 3 may set the predetermined limit current value to a first limit current value (an initial limit current value Iset_ini which will be described later) in a period before a time at which the variable resistance element VR is varied to the low resistance state. The current controller 3 may vary the predetermined limit current value from the first limit current value to a second limit current value (a set current value Iset which will be described later), after the variable resistance element VR is varied to the low resistance state.

The timing control circuit 20 may so supply the current compliance circuit 14 with a timing control signal that the predetermined limit current value is varied to the second limit current value after a certain period of time passes from starting of the setting operation. The timing signal may vary the limit current value.

[1.1.2 Configuration Example of Current Compliance Circuit]

The current compliance circuit 14 may limit the current flowing through the bit line BL to the predetermined limit current value. FIG. 5 illustrates a circuit example of the current compliance circuit 14.

Referring to FIG. 5, the current compliance circuit 14 may include PMOS transistors T11 and T12 and a constant current source 33. Gate terminals of the PMOS transistors T11 and T12 may be coupled to each other. The transistor T11 may be coupled to the bit line BL.

The transistors T11 and T12 and the constant current source 33 may configure a current mirror circuit. In a case where the transistor T11 operates in a saturated region, a constant current of the constant current source 33 may be supplied to the bit line BL as a compliance current Icomp that is to be the predetermined limit current.

[1.2 Operation]
[1.2.1 Setting Operation]

Next, an example of the setting operation in the present embodiment is described referring to FIGS. 7 and 8. An upper part of each of FIGS. 7 and 8 illustrates voltage waveforms where a horizontal axis indicates time and a vertical axis indicates a voltage value. A lower part of each of FIGS. 7 and 8 illustrates current waveforms where a horizontal axis indicates time and a vertical axis indicates a current value.

The reading/writing circuit 15 may first drive all of the bit lines BL and the word lines WL to a common voltage Vcommon via the bit line decoder 12 and the word line decoder 13 before performing the setting operation (FIG. 8).

Further, the current compliance circuit 14 may set the limit current value to the initial limit current value.

When the setting operation is started, the reading/writing circuit 15 and the word line decoder 13 may drive the selected word line to a ground potential Vss. Meanwhile, the reading/writing circuit 15 and the bit line decoder 12 may drive the selected bit line to a set voltage Vset. At this time, a drive of the bit line BL may be performed by driving with the current having the current value limited by the compliance circuit 14.

When the voltage applied to the selection element SE in the memory cell MC is increased, a current flows through the memory cell MC owing to the characteristics of the selection element SE illustrated in FIG. 6. At that time, or when the voltage applied to the memory cell MC is further increased and the predetermined voltage Vth necessary for variation to the low resistance state is applied to the variable resistance element VR in the high resistance state in the memory cell MC, the variable resistance element VR may be varied to the low resistance state (at a time t0 in FIG. 8).

An electric charge charged in the bit line BL at that time may be transferred to the word line WL via the memory cell MC in accordance with a decrease in resistance value. In contrast, the voltage of the bit line BL by the moment at which variation to the low resistance state is performed may be increased at a low slew rate in accordance with the initial current that is limited to be small by the current compliance circuit 14 as the compliance current Icomp. At this time, the slew rate may be represented by $\Delta t/\Delta v = Cbl/Iset\_ini$ where Iset_ini (the first limit current value) is the initial limit current value of the compliance current Icomp, and Cbl is a bit line capacitance.

When an increase in voltage of the bit line BL is moderate, the variation to the low resistance state may be performed moderately. Therefore, the peak value of the current derived from the electric charge of the bit line BL that is transferred to the word line WL via the memory cell MC upon the variation to the low resistance state may be smaller than that in a case where the current is not limited, or that in a case where the current is limited to a higher current value.

After the memory cell MC is vaired to the low resistance state, the timing control circuit 20 may so supply the timing control signal to the current compliance circuit 14 that the current compliance circuit 14 varies the compliance current Icomp as the limit current. The current compliance circuit 14 may set, on the basis of the timing control signal, the limit current value to the set current value Iset (the second limit current value) that is necessary for the resistance value of the low resistance state of the setting operation and stabilization thereof. Thereafter, the set current value Iset necessary for the stabilization of the low resistance state described above may be applied for a necessary time. The set operation is thereby completed.

Here, referring to FIG. 7, description is given of a difference in peak current deriving from the limit current value in a case where the voltage of the bit line BL is increased by current driving. FIG. 7 illustrates characteristics in a case where the limit current value as the compliance current Icomp is set to Icomp1 and in a case where the limit current value is set to Icomp2 which is smaller than Icomp1.

In FIG. 7, BL(1) indicates the voltage of the bit line BL in the case where the limit current value is set to Icomp1, and Icell(1) indicates the current flowing through the memory cell MC. Further, BL(2) indicates the voltage of the bit line BL in the case where the limit current value is set to Icomp2, and Icell(2) indicates the current flowing through the memory cell MC.

An increase rate of the voltage at a time when the bit line BL is varied from the high resistance state to the low resistance state may be greater in the case where the limit current value is higher (Icomp1), and the peak of the current flowing through the memory cell MC may be also higher. In the case where the limit current value is lower (Icomp2), the increase rate of the voltage at the time of the variation to the low resistance state may be smaller. Accordingly, the variation to the low resistance state may be more moderate. Therefore, the peak of the current flowing through the memory cell MC may be lower.

In an operation example illustrated in FIG. 8, first, the initial limit current value Iset_ini (the first limit current value) may be set as the limit current value, and the setting operation may be thereby started. This may suppress the peak current upon the variation to the low resistance state (Icell_1 in FIG. 8). Thereafter, setting of the limit current value may be performed again to set the limit current value to the set current value Iset (the second limit current value) that is actually necessary for the setting operation. The set current value Iset necessary for the setting operation may be thus caused to flow through the memory cell MC (Icell_2 in FIG. 8)

[1.3 Effect]

According to the present embodiment, the current flowing through the bit line BL may be appropriately limited upon performing of the setting operation. Accordingly, it is possible to achieve stabilization upon the setting operation. According to the present embodiment, the slew rate of the voltage of the bit line BL before the variation in resistance may be lowered upon the setting operation. This decreases the peak value of the transient current flowing through the memory cell MC. Accordingly, it is possible to prevent the characteristics of the memory cell MC from being degraded and prevent the memory cell MC from being broken, for example. Further, the predetermined set current value Iset is allowed to flow after the variation in resistance. It is therefore possible to achieve stable characteristics.

It is to be noted that the effects described herein are mere examples and not limitative. Further, any other effect may be provided. The same is applicable to other embodiments and modifications described below.

2. First Modification of First Embodiment

Next, a first modification of the first embodiment of the disclosure is described. Part that has a configuration and a working similar to those in the foregoing first embodiment may not be further described below where appropriate.

[2.1 Configuration]

[2.1.1 Overall Configuration Example of Non-Volatile Memory Device]

FIG. 9 illustrates an example of an overall configuration of a non-volatile memory device 1-1 according to the first modification of the first embodiment of the disclosure. The non-volatile memory device 1-1 may include a current controller 3A instead of the current controller 3 that includes the current compliance circuit 14 and the timing control circuit 20 in the non-volatile memory device 1 illustrated in FIG. 3. The current controller 3A may include a current compliance circuit 14A and a timing control circuit 20A. The current compliance circuit 14 and the timing control circuit 20 illustrated in FIG. 3 may be provided for controlling the current flowing through the bit line BL. However, the current compliance circuit 14A and the timing control circuit 20A in the present modification may be provided for controlling the current flowing through the word line WL. A configuration other than this may be substantially similar to the configuration of the non-volatile memory device 1 illustrated in FIG. 3. Further, description is provided referring to an example case where the configuration of the memory cell MC is of the 1D1R type described above.

The current controller 3A may so control the current that is to flow through the word line WL that the current that is caused to flow through the second wiring (the word line WL) by the reading/writing circuit 15 upon performing of the writing of the data is limited to a predetermined limit current value. The timing control circuit 20A may so supply the current compliance circuit 14A with a timing control signal that the current compliance circuit 14A varies the limit current value to the second limit current value after a certain period of time passes from starting of the setting operation. The timing control signal may vary the limit current value.

[2.1.2 Configuration Example of Current Compliance Circuit]

The current compliance circuit 14A may limit the current flowing through the word line WL to the predetermined limit current value. FIG. 10 illustrates a circuit example of the current compliance circuit 14A.

Referring to FIG. 10, the current compliance circuit 14A may include NMOS transistors T11A and T12A and a constant current source 33A. Gate terminals of the NMOS transistors T11A and T12A may be coupled to each other. The transistor T11A may be coupled to the word line WL.

The transistors T11A and T12A and the constant current source 33A may configure a current mirror circuit. In a case where the transistor T11A operates in a saturated region, a constant current of the constant current source 33A may be supplied to the word line WL as a compliance current Icomp that is to be the predetermined limit current.

[2.2 Operation]

[2.2.1 Setting Operation]

Next, an example of the setting operation in the present modification is described referring to FIG. 11. An upper part of FIG. 11 illustrates voltage waveforms where a horizontal axis indicates time and a vertical axis indicates a voltage value. A lower part of FIG. 11 illustrates current waveforms where a horizontal axis indicates time and a vertical axis indicates a current value.

The reading/writing circuit 15 may first drive all of the bit lines BL and the word lines WL to the common voltage Vcommon via the bit line decoder 12 and the word line decoder 13 before performing the setting operation.

When the setting operation is started, the reading/writing circuit 15 and the word line decoder 13 may drive the selected word line to the ground potential Vss. Meanwhile, the reading/writing circuit 15 and the bit line decoder 12 may drive the selected bit line to the set potential Vset. At this time, a drive of the word line WL may be performed by driving with the current having the current value limited by the current compliance circuit 14A.

When the voltage applied to the selection element SE in the memory cell MC is increased, a current flows through the memory cell MC owing to the characteristics of the selection element SE illustrated in FIG. 6. At that time, or when the voltage applied to the memory cell MC is further increased and the predetermined voltage Vth necessary for variation to the low resistance state is applied to the variable resistance element VR in the high resistance state in the memory cell MC, the variable resistance element VR may be varied to the low resistance state (at a time t0 in FIG. 11).

An electric charge charged in the bit line BL at that time may be transferred to the word line WL via the memory cell MC in accordance with a decrease in resistance value. In contrast, the voltage of the word line WL by the moment at which the variation to the low resistance state is performed may be decreased at a low slew rate in accordance with the initial current that is limited to be small by the current compliance circuit 14A as the compliance current Icomp. At this time, the slew rate may be represented by $\Delta t/\Delta v = Cwl/Iset\_ini$ where Iset_ini (the first limit current value) is the initial limit current value of the compliance current Icomp, and Cwl is a word line capacitance.

When a decrease in voltage of the word line WL is moderate, the variation to the low resistance state may be performed moderately. Therefore, the peak value of the current derived from the electric charge of the bit line BL that is transferred to the word line WL via the memory cell MC upon the variation to the low resistance state may be smaller than that in a case where the current is not limited, or that in a case where the current is limited to a higher current value.

After the memory cell MC is varied to the low resistance state, the timing control circuit 20A may so supply the timing control signal to the current compliance circuit 14A that the current compliance circuit 14A varies the compliance current Icomp as the limit current. The current compliance circuit 14A may set, on the basis of the timing control signal, the limit current value to the set current value Iset (the second limit current value) that is necessary for the resistance value of the low resistance state of the setting operation and stabilization thereof. Thereafter, the set current value Iset necessary for the stabilization of the low resistance state described above may be applied for necessary time. The setting operation may be thereby completed.

The operation example illustrated in FIG. 11 is different from the operation example illustrated in FIG. 8 in that voltage driving with the set voltage Vset is performed on the bit line BL and current driving based on the control by the current compliance circuit 14A is performed on the word line WL.

[2.3 Effect]

According to the present modification, the current flowing through the word line WL may be appropriately limited upon performing of the setting operation. Accordingly, it is possible to achieve stabilization upon the setting operation. According to the present modification, the slew rate of the voltage of the word line WL before the variation in resistance may be lowered upon the setting operation. This decreases the peak value of the transient current flowing through the memory cell MC. Accordingly, it is possible to prevent the characteristics of the memory cell MC from being degraded and prevent the memory cell MC from being broken, for example. Further, the predetermined set current value Iset is allowed to flow after the variation in resistance. It is therefore possible to achieve stable characteristics.

3. Second Modification of First Embodiment

Next, a second modification of the first embodiment of the disclosure is described. Part that has a configuration and a working similar to those in the foregoing first embodiment or the first modification of the first embodiment may not be further described below where appropriate.

[3.1 Configuration]
[3.1.1 Overall Configuration Example of Non-volatile Memory Device]

FIG. 12 illustrates an example of an overall configuration of a non-volatile memory device 1-2 according to the second modification of the first embodiment of the disclosure. The non-volatile memory device 1-2 may include a current controller 3B instead of the current controller 3 that includes the current compliance circuit 14 and the timing control circuit 20 in the non-volatile memory device 1 illustrated in FIG. 3. The current controller 3B may include the current compliance circuit 14 and a current detection circuit 22. A configuration other than this may be substantially similar to the configuration of the non-volatile memory device 1 illustrated in FIG. 3. Further, description is provided referring to an example case where the configuration of the memory cell MC is of the 1D1R type described above.

[3.1.2 Configuration Example of Current Detection Circuit]

The current controller 3B may detect whether the current that is necessary for the variable resistance element VR to be varied to the second resistance state (the low resistance state) flows through the first wiring (the bit line BL). The current controller 3B may vary the predetermined limit current value to the second limit current value on the basis of a result of the detection. The current detection circuit 22 may detect the current flowing through the bit line BL, and supply a result of the detection to the current compliance circuit 14. FIG. 13 illustrates a circuit example of the current detection circuit 22.

Referring to FIG. 13, the current detection circuit 22 may have a configuration including inverters INV1 and INV2, a comparator CP1, NMOS transistors T1 and T2, and a current detection resistance R1.

A non-inversion input terminal (+) of the comparator CP1 may be coupled to the bit line BL that is coupled to the current detection resistance R1. An inversion input terminal (−) of the comparator CP1 may receive a reference current Iref. The comparator CP1 may be a current detection circuit that outputs a high level signal as a detection signal when the current value of the bit line BL is higher than the reference current Iref, and outputs a low level signal as the detection signal when the current value of the bit line BL is lower than the reference current Iref.

When the setting operation is to be started, an initialization pulse int_pls may be applied to a gate of the transistor T2 in advance, thereby initializing a latch including the inverters INV1 and INV2. When the latch is initialized, an output Iini_en may be brought to a high level and an output Iset_en may be brought to a low level.

The transistor T1 may couple the current detection circuit and the latch to each other when the latch is in a initialized state. When the current detection circuit outputs the high level signal as the detection signal, the output Iini_en may be brought to a low level. The transistor T1 may thereby release the coupling between the current detection circuit and the latch. As a result, the increase in the current of the bit line BL may be detected only once during a period in which the setting operation is performed once.

[3.2 Operation]
[3.2.1 Setting Operation]

Next, an example of the setting operation in the present modification is described referring to FIG. 14. An upper part of FIG. 14 illustrates voltage waveforms of the bit line BL and the word line WL where a horizontal axis indicates time and a vertical axis indicates a voltage value. A middle part of FIG. 14 illustrates a current waveform of the bit line BL where a horizontal axis indicates time and a vertical axis indicates a current value. A lower part of FIG. 14 illustrates a voltage waveform of the detection signal of the current detection circuit 22 where a vertical axis indicates a voltage value.

The reading/writing circuit 15 may first drive all of the bit lines BL and the word lines WL to the common voltage Vcommon via the bit line decoder 12 and the word line decoder 13 before performing the setting operation.

Thereafter, when the setting operation is started, and the predetermined voltage Vth that is necessary for the variation to the low resistance state is applied to the variable resistance element VR in the high resistance state in the memory cell MC, the variable resistance element VR may be varied to the low resistance state (at a time t0 in FIG. 14). The foregoing operation may be similar to that of the operation example illustrated in FIG. 8 described above.

Here, the current detection circuit 22 may detect the flowing, through the bit line BL, of the current necessary for the variation to the low resistance state on the basis of the reference current Iref as a threshold current. When the current detection circuit 22 detects that the current $I_{BL}$ of the bit line BL exceeds the reference current Iref, the current compliance circuit 14 may vary the compliance current Icomp as the limit current. The current compliance circuit 14 may set the limit current value to the set current value Iset (the second limit current value) that is necessary for the resistance value of the low resistance state of the setting operation and stabilization thereof. Thereafter, the set current value Iset necessary for the stabilization of the low resistance state described above may be applied for necessary time. The setting operation is thereby completed.

In the operation example illustrated in FIG. 14, first, the initial limit current value Iset_ini (the first limit current value) may be set as the limit current value, and the setting operation may be started. This suppresses the peak current upon the variation to the low resistance state (Icell_1 in FIG. 14). Thereafter, setting of the limit current value may be so performed again that the limit current value is set to the set current value Iset (the second limit current value) that is actually necessary for the setting operation at a timing at which the variation to the low resistance state is detected by the current detection circuit 22. This allows the set current value Iset necessary for the setting operation to flow through the memory cell MC (Icell_2 in FIG. 14).

[3.3 Effect]

According to the present modification, the current that is to flow through the bit line BL is appropriately limited upon performing of the setting operation. It is therefore possible to achieve stabilization upon the setting operation. According to the present modification, the current flowing through the bit line BL is detected. It is therefore possible to control the current after setting with higher accuracy.

4. Second Embodiment

Next, a second embodiment of the disclosure is described. Part that has a configuration and a working similar to those in the foregoing first embodiment or the first modification of the first embodiment may not be further described below where appropriate.

[4.1 Configuration]
[4.1.1 Overall Configuration Example of Non-volatile Memory Device]

FIG. 15 illustrates an example of an overall configuration of a non-volatile memory device 2 according to a second embodiment of the disclosure. The non-volatile memory device 2 may include a voltage controller 4 instead of the current controller 3, compared with the configuration of the non-volatile memory device 1 illustrated in FIG. 3. The voltage controller 4 may include a timing control circuit 20B. A configuration other than this may be substantially similar to the configuration of the non-volatile memory device 1 illustrated in FIG. 3. Further, description is provided referring to an example case where the configuration of the memory cell MC is of the 1D1R type described above.

Further, the present embodiment is described referring to, as an example, an operation of writing the data "0" on the memory cell MC as the resetting operation that performs erasing of the data. Further, the present embodiment is described referring to, as an example, a case in which the resetting operation is performed by varying the variable resistance element VR in the memory cell MC from the second resistance state (the low resistance state) to the first resistance state (the high resistance state).

The voltage controller 4 may so control a voltage to be applied to the word line WL that the voltage that is to be applied to the second wiring (the word line WL) by the reading/writing circuit 15A upon performing of the erasing of the data is to be limited to a predetermined limit voltage value. The voltage controller 4 may set the predetermined limit voltage value to a first limit voltage value (an initial reset voltage Vreset1 which will be described later) in a period before a time at which the variable resistance element VR is varied to the high resistance state. The voltage controller 4 may vary the predetermined limit voltage value from the first limit voltage value to a second limit voltage value (a later reset voltage Vreset2 which will be described later), after the variable resistance element VR is varied to the high resistance state.

The timing control circuit 20B may so supply the reading/writing circuit 15A with a timing control signal that the reading/writing circuit 15A varies the predetermined limit voltage value to the second limit voltage value after a certain period of time passes from starting of the resetting operation. The timing control signal may vary the voltage that drives the word line WL.

[4.1.2 Configuration Example of Voltage Switching Circuit]

The reading/writing circuit 15A may include a circuit that drives the word line WL that writes the data "0" (performs resetting) to a predetermined voltage Vreset necessary for resetting ((the initial reset voltage Vreset1 or the later reset voltage Vreset2). This circuit may have a function of switching the voltage to be applied to the word line WL. FIG. 16 illustrates a circuit example of the voltage switching circuit 23.

Referring to FIG. 16, the voltage switching circuit 23 may have a configuration including PMOS transistors T3 and T4, an NMOS transistor T5, and an AND circuit AND1. A gate terminal of the transistor T5 may be coupled to an output terminal of the AND circuit AND1.

In the voltage switching circuit 23, when a first reset enable signal /reset_en1 is at a high level, the transistor T3 may be turned on, and the voltage of the word line WL may be set to the initial reset voltage Vreset1. Further, when the second reset enable signal /reset_en2 is at a high level, the transistor T4 may be turned on, and the voltage of the word line WL may be set to the later reset voltage Vreset2. The first reset enable signal /reset_en1 and the second reset enable signal /reset_en2 may not be allowed to be at high levels at the same time. When the first reset enable signal /reset_en1 and the second reset enable signal /reset_en2 are at low levels at the same time, the AND circuit AND1 may output a high level signal, the transistor T5 may be turned on, and the transistors T3 and T4 may be turned off. In this case, the word line WL may be non-selected, and the voltage thereof may be the common voltage Vcommon.

[4.2 Operation]

[4.2.1 Resetting Operation]

Before describing the resetting operation in the present embodiment, a resetting operation in a comparative example of the present embodiment is described referring to FIG. 17. FIG. 17 illustrates voltage waveforms where a horizontal axis indicates time and a vertical axis indicates a voltage value. In FIG. 17, Vcell indicates a voltage that is to be applied to the selected memory cell MC.

The reading/writing circuit 15A may first drive all of the bit lines BL and the word lines WL to the common voltage Vcommon via the bit line decoder 12 and the word line decoder 13 before performing the resetting operation.

When the resetting operation is started, the reading/writing circuit 15A and the bit line decoder 12 may drive the selected bit line to the ground potential Vss. Meanwhile, the reading/writing circuit 15A and the word line decoder 13 may drive the selected word line to the reset voltage Vreset as the predetermined limit voltage.

When a predetermined voltage Vth' is applied to the memory cell MC in the low resistance state at a time t0, the memory cell MC may be varied to the high resistance state. The predetermined voltage Vth' may be able to cause a current necessary for the variation to the high resistance state to flow. Thereafter, when a necessary time period passes after the word line WL is brought to the reset voltage Vreset, the resetting operation may be completed. Here, the minimum voltage may be set as the reset voltage Vreset taking into consideration, for example, the variations in resistance value of the memory cell MC in the low resistance state or variations in current of the selection element SE as a reason why the reset voltage Vreset is higher than the voltage Vth'. In the operation example illustrated in FIG. 17, the voltage Vcell that is to be applied to the memory cell MC that is varied to the high resistance state may exceed the voltage Vhrs_limit in the predetermined range that is necessary for stabilization of those characteristics. Accordingly, for example, the characteristics may be degraded in the memory cell MC in the high resistance state in this case. The memory cell MC may be broken in the worst case.

FIG. 18 illustrates the resetting operation in the present embodiment as a method of solving the foregoing issue.

When the resetting operation is started, the reading/writing circuit 15A and the bit line decoder 12 may drive the selected bit line to the ground potential Vss. Meanwhile, the reading/writing circuit 15A and the word line decoder 13 may drive the selected word line to the initial reset voltage Vreset1 as the predetermined limit voltage.

After starting the resetting operation, an operation performed until the memory cell MC in the low resistance state is varied to the high resistance state may be similar to that in the operation example illustrated in FIG. 17. In the present embodiment, thereafter, the voltage that is to be applied to the word line WL by the reading/writing circuit 15A and the word line decoder 13 may be switched from the initial reset voltage Vreset1 (the first limit voltage value) to the later reset voltage Vreset2 (the second limit voltage value) at a time t1 on the basis of the timing control signal supplied from the timing control circuit 20B. Accordingly, the voltage Vcell that is to be applied to the memory cell MC that is varied to the high resistance state may be dropped by Vreset1-Vreset2.

According to this technique, the voltage Vcell that is to be applied to the memory cell MC that is finally varied to the high resistance state may fall within the voltage Vhrs_limit in the predetermined range that is necessary for stabilization of the characteristics in the high resistance state. It is therefore possible to stabilize the characteristics in the high resistance state. It is to be noted that, in this process, it may be possible that a period in which the voltage Vcell exceeds the voltage Vhrs_limit in the predetermined range is present before or after the time t1. However, as the period is such a short time, the influence on the characteristics of the memory cell MC may be small.

[4.3 Effect]

According to the present embodiment, the voltage to be applied to the word line WL may be appropriately limited upon performing of the resetting of the data. It is therefore possible to achieve stabilization upon the resetting operation. According to the present embodiment, the timing control may be performed on the application voltage that is to be applied to the word line WL after starting of the resetting operation. It is therefore possible to apply, to the memory cell MC, the voltage necessary for stabilizing the characteristics in the high resistance state independently of, for example, variations in characteristics of the memory cell MC.

5. Modification of Second Embodiment

Next, a modification of the second embodiment of the disclosure is described. Part that has a configuration and a working similar to those in the first embodiment, the modifications thereof, and the second embodiment described above may not be further described below where appropriate.

[5.1 Configuration]

[5.1.1 Overall Configuration Example of Non-Volatile Memory Device]

FIG. 19 illustrates an example of an overall configuration of a non-volatile memory device 2-1 according to the modification of the second embodiment of the disclosure. The non-volatile memory device 2-1 may include a voltage controller 4A instead of the voltage controller 4 that includes the timing control circuit 20B in the configuration of the non-volatile memory device 2 illustrated in FIG. 15. The voltage controller 4A may include a current detection circuit 22A. A configuration other than this may be substantially similar to the configuration of the non-volatile memory device 2 illustrated in FIG. 15. Further, description is provided referring to an example case where the configuration of the memory cell MC is of the 1D1R type described above.

[5.1.2 Configuration Example of Current Detection Circuit]

The voltage controller 4A may detect whether the current that is necessary for the variable resistance element VR to be varied to the first resistance state (the high resistance state) flows through the first wiring (the bit line BL). The voltage controller 4A may vary the predetermined limit voltage value to the second limit voltage value on the basis of a result of the detection. The current detection circuit 22A may detect the current flowing through the bit line BL, and supply a result of the detection to the reading/writing circuit 15A. FIG. 20 illustrates a circuit example of the current detection circuit 22A.

Referring to FIG. 20, the current detection circuit 22A may have a configuration including inverters INV1 and INV2, a comparator CP1, NMOS transistors T1 and T2, and a current detection resistance R1.

A non-inversion input terminal (+) of the comparator CP1 may be coupled to the bit line BL that is coupled to the current detection resistance R1. An inversion input terminal (−) of the comparator CP1 may receive a reference current Iref. The comparator CP1 may be a current detection circuit that outputs a high level signal as a detection signal when the current value of the bit line BL is higher than the reference current Iref', and outputs a low level signal as the detection signal when the current value of the bit line BL is lower than the reference current Iref'.

When the resetting operation is to be started, the initialization pulse int_pls may be applied to a gate of the transistor T2 in advance, and a latch including the inverters INV1 and INV2 may be thereby initialized. When the latch is initialized, the output reset_en1 may be brought to a high level and the output reset_en2 may be brought to a low level.

The transistor T1 may couple the current detection circuit and the latch to each other when the latch is in a initialized state. When the current detection circuit outputs the high level signal as the detection signal, the output reset_en1 may be brought to a low level. The transistor T1 may thereby release the coupling between the current detection circuit and the latch. As a result, the increase in the current of the bit line BL may be detected only once during a period in which the resetting operation is performed once.

[5.2 Operation]

[5.2.1 Resetting Operation]

Next, an example of the resetting operation in the present modification is described referring to FIG. 21. An upper part of FIG. 21 illustrates voltage waveforms of the bit line BL and the word line WL where a horizontal axis indicates time and a vertical axis indicates a voltage value. A middle part of FIG. 21 illustrates a current waveform of the bit line BL where a horizontal axis indicates time and a vertical axis indicates a current value. A lower part of FIG. 21 illustrates a voltage waveform of the detection signal of the current detection circuit 22A where a vertical axis indicates a voltage value.

The reading/writing circuit 15A may first drive all of the bit lines BL and the word lines WL to the common voltage Vcommon via the bit line decoder 12 and the word line decoder 13 before performing the resetting operation.

When the resetting operation is started, the reading/writing circuit 15A and the bit line decoder 12 may drive the selected bit line to the ground potential Vss. Meanwhile, the reading/writing circuit 15A and the word line decoder 13 may drive the selected word line to the initial reset voltage Vreset1 as the predetermined limit voltage.

When the predetermined voltage Vth' is applied to the memory cell MC in the low resistance state at a time t0, the memory cell MC may be varied to the high resistance state. The predetermined voltage Vth' may be able to cause a current necessary for the variation to the high resistance state to flow. At that time, the current detection circuit 22A may detect that the current necessary for the variation to the high resistance state flows, on the basis of the reference current Iref as a threshold current. When the current detection circuit 22A detects that the current $I_{BL}$ of the bit line BL exceeds the reference current Iref', the reading/writing circuit 15A and the word line decoder 13 may switch the voltage to be applied to the word line WL from the initial reset voltage Vreset1 (the first limit voltage value) to the later reset voltage Vreset2 (the second limit voltage value). Accordingly, the voltage Vcell that is to be applied to the memory cell MC that is varied to the high resistance state may be dropped by Vreset1-Vreset2 as in the foregoing second embodiment.

According to this technique, the voltage Vcell that is to be applied to the memory cell MC that is finally varied to the high resistance state may fall within the voltage Vhrs_limit in the predetermined range that is necessary for stabilization of the characteristics in the high resistance state. It is therefore possible to stabilize the characteristics in the high resistance state.

Moreover, according to this technique, the voltage applied to the word line WL may be immediately switched to the later reset voltage Vreset2 at a time corresponding to the moment at which the memory cell MC in the low resistance state is varied to the high resistance state. Therefore, the time period in which the voltage Vcell exceeds the voltage Vhrs_limit in the predetermined range may not be present at all, or may be largely reduced compared to that in the foregoing second embodiment. Moreover, the timing at which the switching to the later reset voltage Vreset2 is performed may compensate, for example, variations in characteristics of the memory cell MC in the low resistance state or variation in temperature. This may therefore achieve a function with extremely high accuracy.

[5.3 Effect]

According to the present modification, the voltage that is to be applied to the word line WL may be appropriately limited upon performing of the resetting of the data. It is therefore possible to achieve stabilization upon the resetting operation. According to the present modification, the application voltage applied to the word line WL after starting of the resetting operation may be controlled by detecting the current flowing through the bit line BL. It is therefore possible to control, with higher accuracy, the voltage Vcell that is to be applied to the memory cell MC after starting of the resetting operation.

6. Other Embodiments

The technology according to the disclosure is not limited to the description above of the respective embodiments and the modifications thereof, and may be modified in various ways.

For example, the non-volatile memory device according to the technology is also applicable to a memory device other than the variable resistance memory device (ReRAM) such as CBRAM, PCRAM, MRAM, and STTRAM.

Moreover, the description is given above of the configuration related to the setting operation in the first embodiment and of the configuration related to the resetting operation in the second embodiment. However, the configuration related to the setting operation in the foregoing first embodiment and the configuration related to the resetting operation in the foregoing second embodiment may be combined.

Moreover, for example, the present technology may employ the following configurations.

(1)

A non-volatile memory device including:

a memory cell that is disposed at an intersection of a first wiring and a second wiring, and includes a variable resistance element having a resistance state that is variable between a first resistance state and a second resistance state;

a writing circuit that varies the variable resistance element from the first resistance state to the second resistance state, and thereby performs writing of data on the memory cell; and a current controller that controls a current and thereby limits the current to a predetermined limit current value, the current being caused to flow through the first wiring or the second wiring by the writing circuit upon performing of the writing of the data, in which the current controller causes the predetermined limit current value to be a first limit current value in a period before a time at which the variable resistance element is varied to the second resistance state, and varies the predetermined limit current value from the first limit current value to a second limit current value after the time at which the variable resistance element is varied to the second resistance state.

(2)

The non-volatile memory device according to (1), in which the first limit current value is lower than the second limit current value.

(3)

The non-volatile memory device according to (1) or (2), in which the current controller varies the predetermined limit current value to the second limit current value after a predetermined period passes from starting of an operation of the writing of the data by the writing circuit.

(4)

The non-volatile memory device according to (1) or (2), in which the current controller detects whether a current that is necessary for the variable resistance element to be varied to the second resistance state flows through the first wiring or the second wiring, and varies the predetermined limit current value to the second limit current value depending on a result of the detection.

(5)

The non-volatile memory device according to any one of (1) to (4), in which the first resistance state is a high resistance state, and the second resistance state is a low resistance state.

(6)

A non-volatile memory device including:

a memory cell that is disposed at an intersection of a first wiring and a second wiring, and includes a variable resistance element having a resistance state that is variable between a first resistance state and a second resistance state;

a writing circuit that varies the variable resistance element from the second resistance state to the first resistance state, and thereby performs erasing of data stored in the memory cell; and a voltage controller that controls a voltage and thereby limits the voltage to a predetermined limit voltage value, the voltage being to be applied to the second wiring by the writing circuit upon performing of the erasing of the data, in which the voltage controller causes the predetermined limit voltage value to be a first limit voltage value in a period before a time at which the variable resistance element is varied to the first resistance state, and varies the predetermined limit voltage value from the first limit voltage value to a second limit voltage value after the time at which the variable resistance element is varied to the first resistance state.

(7)

The non-volatile memory device according to (6), in which the first limit voltage value is higher than the second limit voltage value.

(8)

The non-volatile memory device according to (6) or (7), in which the voltage controller varies the predetermined limit voltage value to the second limit voltage value after a predetermined period passes from starting of an operation of the erasing of the data by the writing circuit.

(9)

The non-volatile memory device according to (6) or (7), in which the voltage controller detects whether a current that is necessary for the variable resistance element to be varied to the first resistance state flows through the first wiring, and varies the predetermined limit voltage value to the second limit voltage value depending on a result of the detection.

(10)

The non-volatile memory device according to any one of (6) to (9), in which the first resistance state is a high resistance state, and the second resistance state is a low resistance state.

(11)

A method of controlling a non-volatile memory device, the method including:

with a writing circuit, varying a variable resistance element from a first resistance state to a second resistance state, and thereby performing writing of data on a memory cell that is disposed at an intersection of a first wiring and a second wiring, and includes the variable resistance element having a resistance state that is variable between the first resistance state and the second resistance state; and controlling a current, and thereby limiting the current to a predetermined limit current value, the current being caused to flow through the first wiring or the second wiring by the writing circuit upon performing of the writing of the data, in which, as a control of the current, the predetermined limit current value is caused to be a first limit current value in a period before a time at which the variable resistance element is varied to the second resistance state, and the predetermined limit current value is varied from the first limit current value to a second limit current value after the time at which the variable resistance element is varied to the second resistance state.

(12)

A method of controlling a non-volatile memory device, the method including:

with a writing circuit, varying a variable resistance element from a second resistance state to a first resistance state, and thereby performing erasing of data on a memory cell that is disposed at an intersection of a first wiring and a second wiring, and includes the variable resistance element having a resistance state that is variable between the first resistance state and the second resistance state; and controlling a voltage, and thereby limiting the voltage to a predetermined limit voltage value, the voltage being to be applied to the second wiring by the writing circuit upon performing of the erasing of the data, in which, as a control of the voltage, the predetermined limit voltage value is caused to be a first limit voltage value in a period before a time at which the variable resistance element is varied to the first resistance state, and the predetermined limit voltage value is varied from the first limit voltage value to a second limit voltage value after the time at which the variable resistance element is varied to the first resistance state.

This application is based upon and claims the benefit of priority of the Japanese Patent Application No. 2014-225924 filed in the Japan Patent Office on Nov. 6, 2014, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A non-volatile memory device comprising:
a writing circuit configured to:
perform a writing operation that writes data onto a memory cell by varying a resistance state of a variable resistance element from a first resistance state to a second resistance state; and a current controller configured to:
perform, before the writing circuit performs the writing operation, a first current-limiting operation that limits current flowing through the memory cell to a first limit current value, and perform, after the writing circuit performs the writing operation, a second current-limiting operation that varies the current flowing through the memory cell from the first limit current value to a second limit current value.

2. The non-volatile memory device according to claim 1, further comprising:
the memory cell, the memory cell comprises the variable resistance element.

3. The non-volatile memory device according to claim 1, wherein the resistance state of the variable resistance element is higher in the first resistance state than in the second resistance state.

4. The non-volatile memory device according to claim 1, wherein the current controller is configured to perform the first current-limiting operation in a manner that sets the current flowing through the memory cell to the first limit current value.

5. The non-volatile memory device according to claim 1, wherein the second current-limiting operation limits the current flowing through the memory cell to the second limit current value.

6. The non-volatile memory device according to claim 1, wherein the second limit current value is higher than the first limit current value.

7. The non-volatile memory device according to claim 1, wherein the current controller is configured to perform the second current-limiting operation in a manner that sets the current flowing through the memory cell to the second limit current value.

8. The non-volatile memory device according to claim 1, wherein the current controller is electrically connected to the writing circuit.

9. The non-volatile memory device according to claim 1, wherein the memory cell is disposed at an intersection of a first wiring and a second wiring.

10. The non-volatile memory device according to claim 9, wherein the first wiring and the second wiring are electrically connected to the memory cell.

11. The non-volatile memory device according to claim 9, wherein the writing circuit is configured to change the resistance state of the variable resistance element from the first resistance state to the second resistance state by driving the first wiring to a predetermined voltage.

12. The non-volatile memory device according to claim 11, wherein the first wiring is a bit line in a memory cell array when the second wiring is a word line in the memory cell array.

13. The non-volatile memory device according to claim 12, wherein the second wiring is the bit line when the first wiring is the word line.

14. The non-volatile memory device according to claim 13, wherein the current controller is configured to detect whether or not a bit line current is higher than a reference current, the bit line current is current that is present on the bit line.

15. The non-volatile memory device according to claim 12, wherein the memory cell array comprises an array of memory cells, the memory cell is one of the memory cells in the array.

16. A method of controlling a non-volatile memory device, the method comprising:
performing, by a current controller before a writing circuit performs a writing operation, a first current-limiting operation in a manner that limits current flowing through a memory cell to a first limit current value;

performing, by the writing circuit to write data onto the memory cell, a writing operation in a manner that varies a resistance state of a variable resistance element from a first resistance state to a second resistance state; and performing, by the current controller after the writing circuit performs the writing operation, a second current-limiting operation in a manner that varies the current flowing through the memory cell from the first limit current value to a second limit current value.

17. The method according to claim 16, wherein the current controller performs the first current-limiting operation in a manner that sets the current flowing through the memory cell to the first limit current value.

18. The method according to claim 16, wherein the second current-limiting operation limits the current flowing through the memory cell to the second limit current value.

19. The method according to claim 16, wherein the second limit current value is higher than the first limit current value.

20. The method according to claim 16, wherein the current controller performs the second current-limiting operation in a manner that sets the current flowing through the memory cell to the second limit current value.

21. The method according to claim 16, wherein the current controller is electrically connected to the writing circuit.

22. The method according to claim 16, wherein the memory cell comprises the variable resistance element.

* * * * *